(12) United States Patent
Soma et al.

(10) Patent No.: US 7,910,449 B2
(45) Date of Patent: Mar. 22, 2011

(54) SEMICONDUCTOR DEVICE AND METHOD OF MANUFACTURING THE SAME

(75) Inventors: Mitsuru Soma, Saitama (JP); Hirotsugu Hata, Gunma (JP); Yoshimasa Amatatsu, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 12/836,221

(22) Filed: Jul. 14, 2010

(65) Prior Publication Data
US 2010/0279482 A1 Nov. 4, 2010

Related U.S. Application Data

(62) Division of application No. 12/026,593, filed on Feb. 6, 2008, now Pat. No. 7,791,171.

(30) Foreign Application Priority Data

Feb. 9, 2007 (JP) ................................. 2007-030797
Jan. 15, 2008 (JP) ................................. 2008-006276

(51) Int. Cl.
*H01L 21/331* (2006.01)
(52) U.S. Cl. ............ 438/363; 257/E21.37; 257/E29.174

(58) Field of Classification Search .................. 438/363; 257/E21.37, E29.174
See application file for complete search history.

(56) References Cited

U.S. PATENT DOCUMENTS

| 6,864,525 | B2 | 3/2005 | Kaneko et al. |
| 7,067,899 | B2 | 6/2006 | Kanda et al. |
| 2003/0173609 | A1 | 9/2003 | Kaneko et al. |
| 2005/0077571 | A1 | 4/2005 | Kanda et al. |
| 2007/0158754 | A1 | 7/2007 | Soma et al. |
| 2008/0023796 | A1 | 1/2008 | Mita et al. |

FOREIGN PATENT DOCUMENTS

| CN | 1428860 | 7/2003 |
| CN | 1604329 | 4/2005 |
| JP | 09-283646 | 10/1997 |

*Primary Examiner* — David S Blum
(74) *Attorney, Agent, or Firm* — Fish & Richardson P.C.

(57) ABSTRACT

In a semiconductor device according to the present invention, two epitaxial layers are formed on a P type substrate. In the substrate and the epitaxial layers, isolation regions are formed to divide the substrate and the epitaxial layers into a plurality of islands. Each of the isolation regions is formed by connecting first and second P type buried layers with a P type diffusion layer. By disposing the second P type buried layer between the first P type buried layer and the P type diffusion layer, a lateral diffusion width of the first P type buried layer is reduced. By use of this structure, a formation region of the isolation region is reduced in size.

5 Claims, 26 Drawing Sheets

FIG.18 (A)
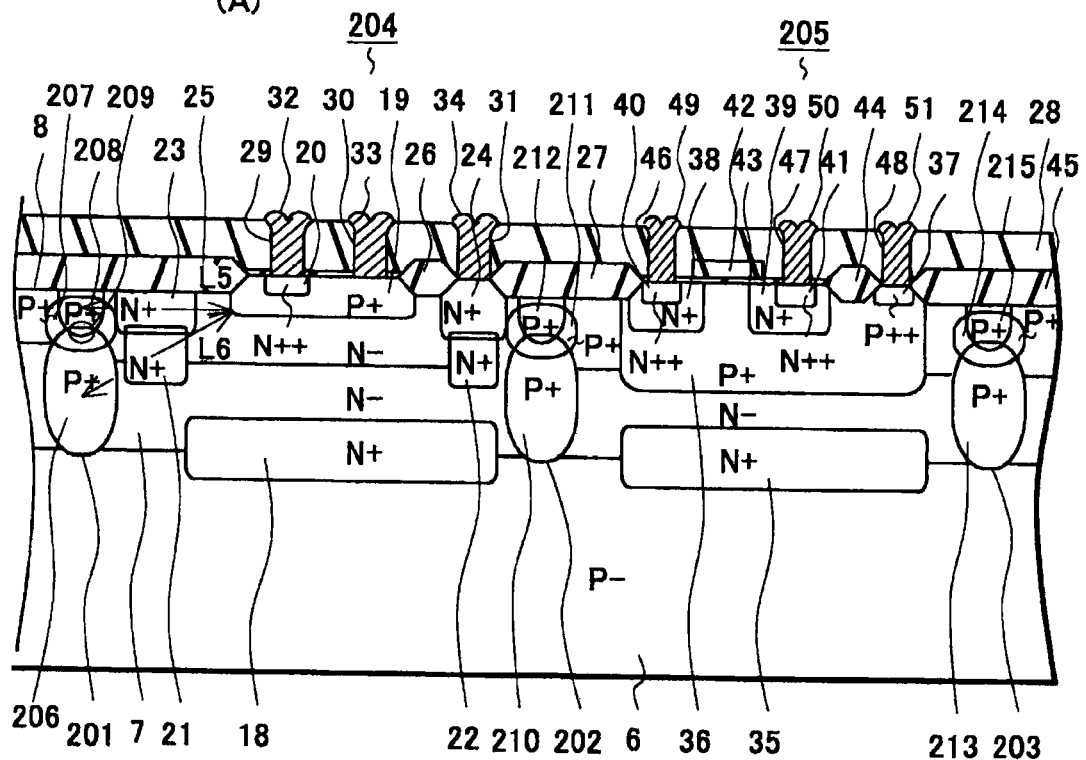
(B)
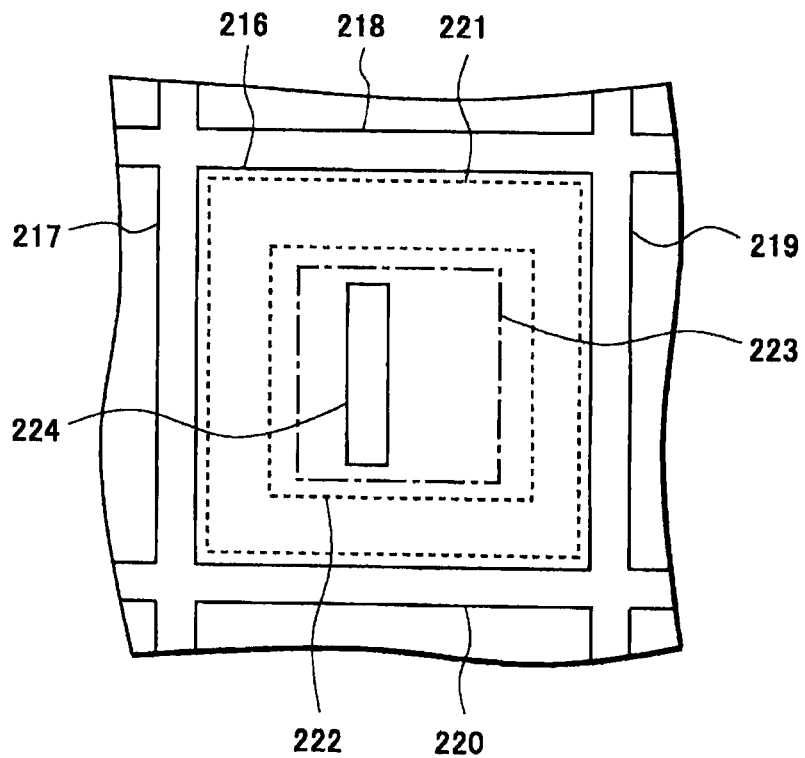

FIG.19
(A)
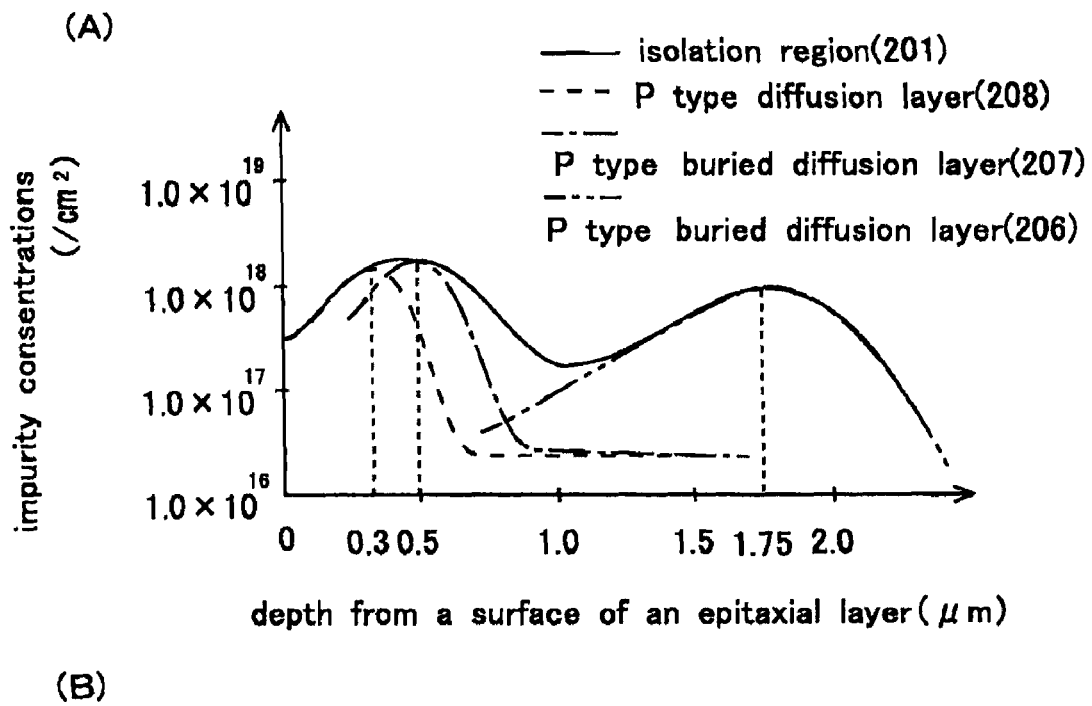
(B)
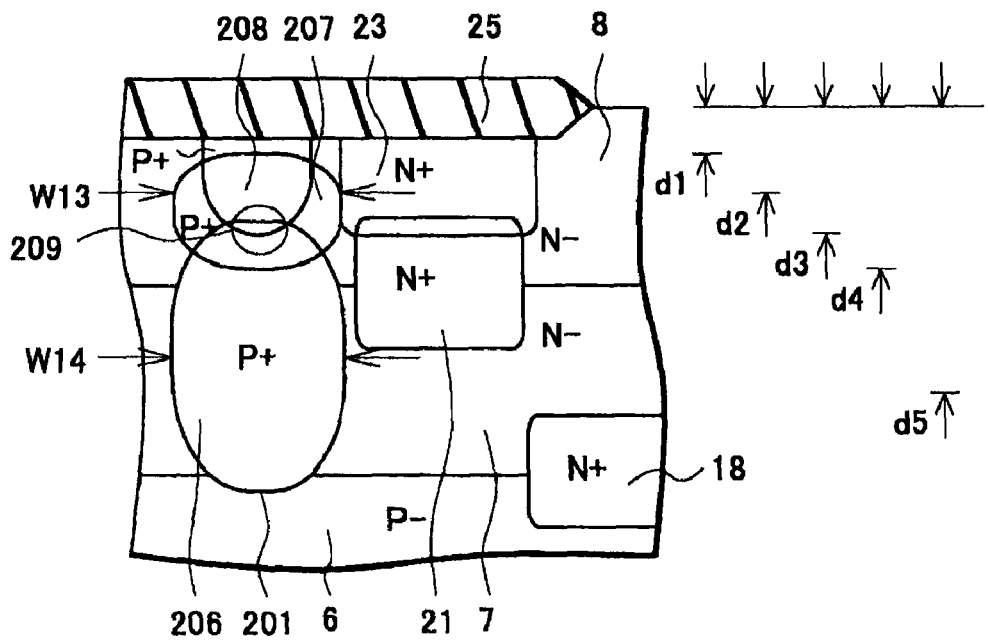

FIG.23
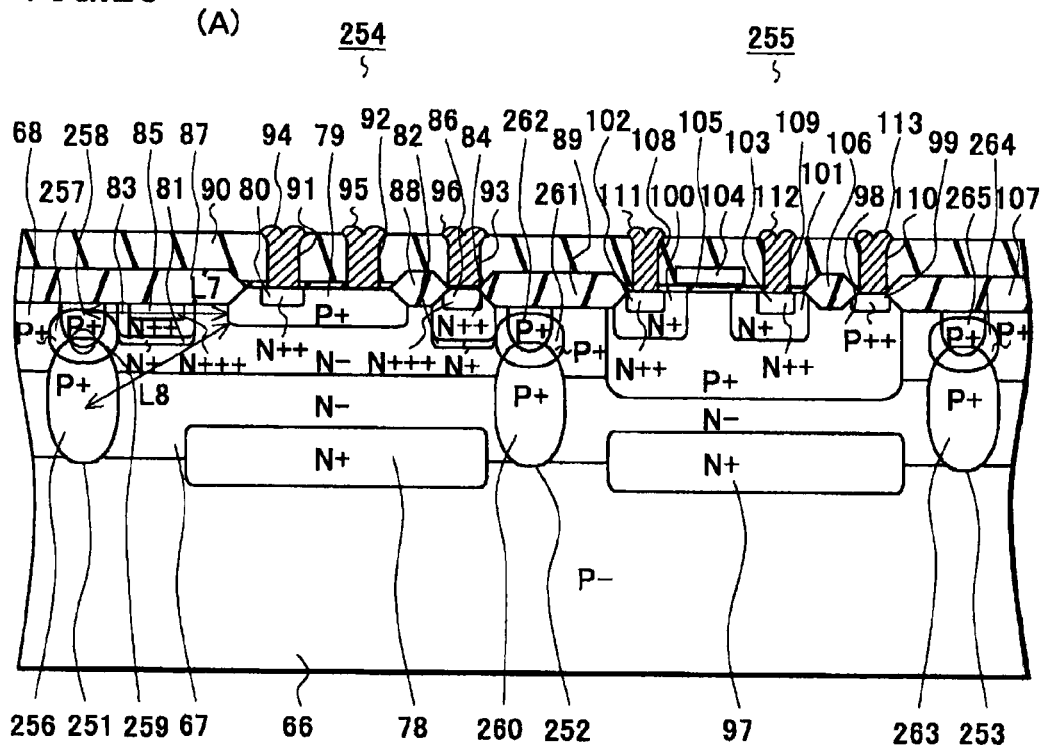
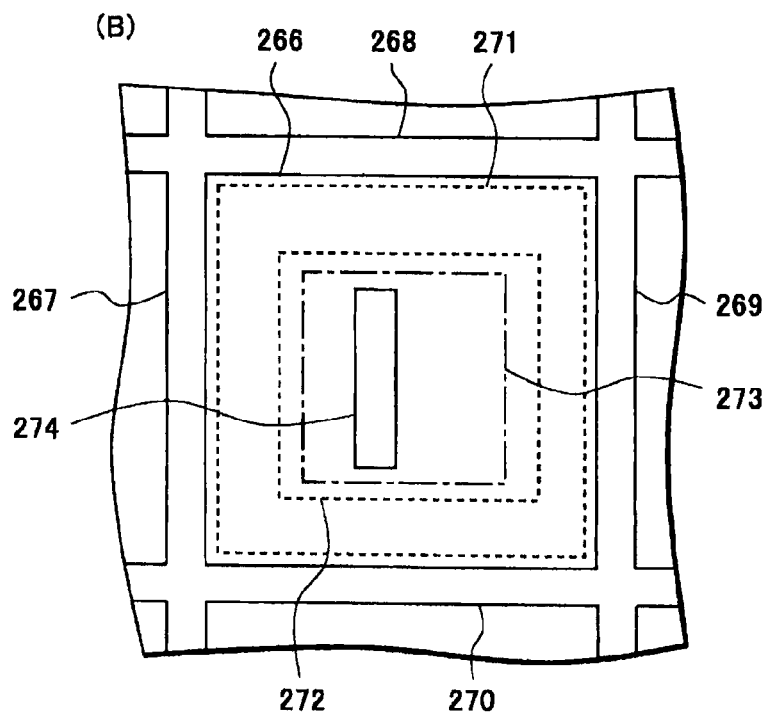

FIG.24
(A)
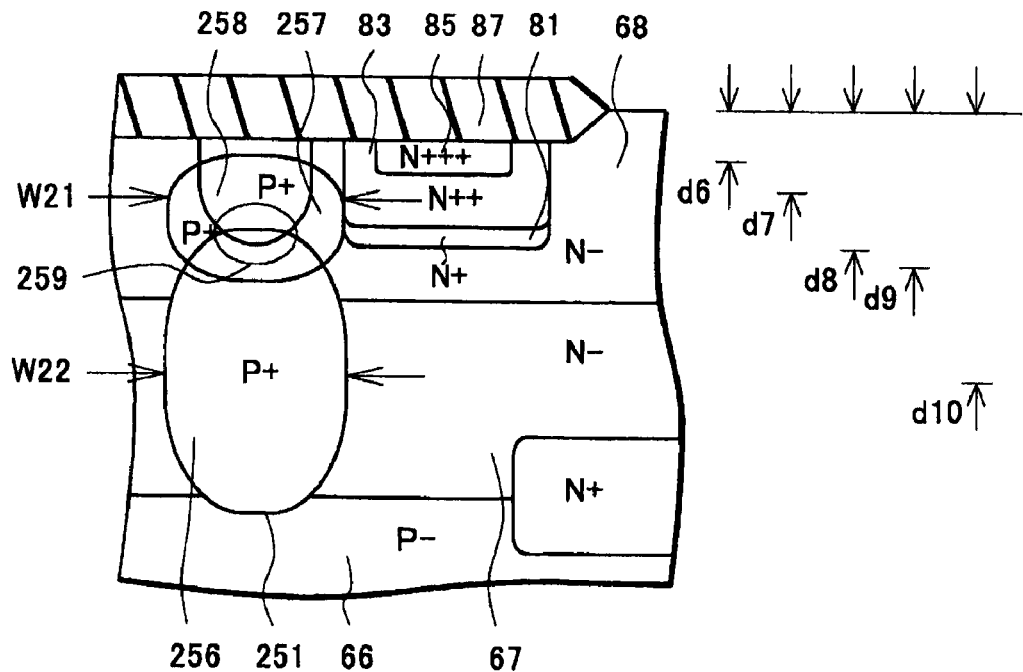
(B)
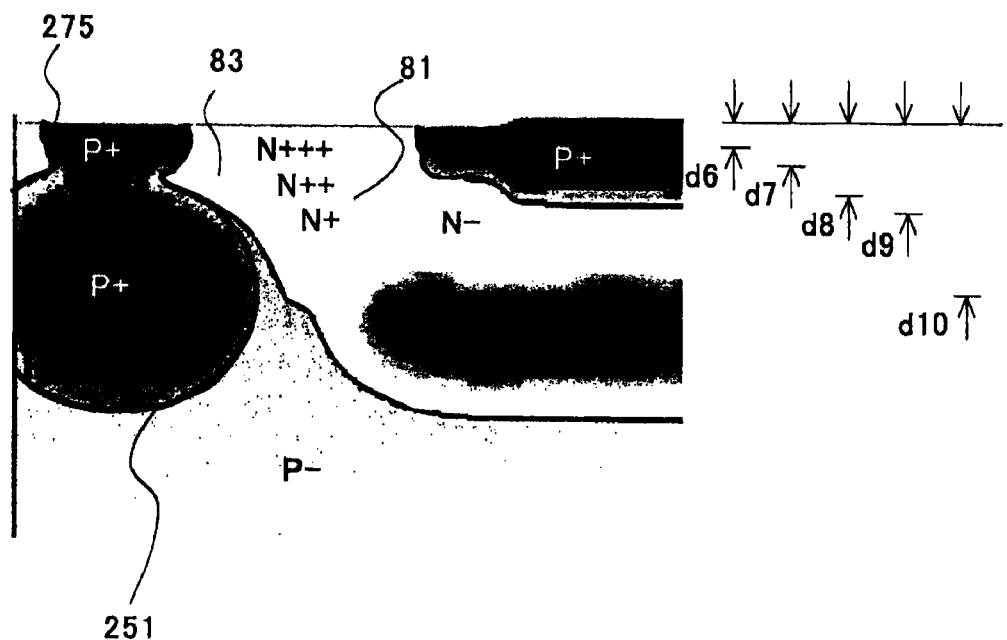

SEMICONDUCTOR DEVICE AND METHOD OF MANUFACTURING THE SAME

This application is a divisional of U.S. Ser. No. 12/026,593 now U.S. Pat. No. 7,791,171, filed on Feb. 6, 2008, which claims priority from Japanese Patent Application Nos. JP2007-30797 filed on Feb. 9, 2007, and JP2008-006276 filed on Jan. 15, 2008, the contents of which are incorporated by reference in their entirety.

BACKGROUND OF THE INVENTION

1. Field of the Invention

The present invention relates to a semiconductor device and a manufacturing method thereof.

2. Description of the Related Art

As an embodiment of a conventional semiconductor device, a structure of the following NPN transistor 281 has been known. As shown in FIG. 25, an N type epitaxial layer (hereinafter, referred to as EPI) 283 is formed on a P type semiconductor substrate 282. In the EPI 283, P type buried diffusion layers (hereinafter, referred to as buried layers) 284 and 285, which are diffused in a vertical direction from a surface of the substrate 282, and P type diffusion layers 286 and 287, which are diffused from a surface of the EPI 283, are formed. Moreover, the EPI 283 is divided into a plurality of island regions (hereinafter, referred to as islands) by isolation regions (hereinafter, referred to as ISOs) 288 and 289, which are formed by connecting the buried layers 284 and 285 with the diffusion layers 286 and 287, respectively. In one of the islands, the NPN transistor 281 is formed, for example. The NPN transistor 281 is mainly formed of an N type buried layer 290 used as a collector region, a P type diffusion layer 291 used as a base region and an N type diffusion layer 292 used as an emitter region. Moreover, the buried layers 284 and 285 are diffused by subjecting the substrate 282 to a dedicated heat treatment. Meanwhile, the diffusion layers 286 and 287 are also diffused by subjecting the substrate 282 to a dedicated heat treatment. By these thermal diffusion steps, the buried layer 284 and the diffusion layer 286 are connected with each other to form the ISO 288, and the buried layer 285 and the diffusion layer 287 are connected with each other to form the ISO 289. This technique is described, for instance, in Japanese Patent Application Publication No. Hei 9 (1997)-283646 (Pages 3, 4 and 6, FIGS. 1 and 5 to 7).

As described above, in the conventional semiconductor device, the thickness of the EPI 283 is determined by taking account of the breakdown voltage of the NPN transistor 281. For example, in the case where a power semiconductor element and a control semiconductor element are formed on the same substrate 282, the thickness of the EPI 283 is determined in accordance with breakdown voltage characteristics of the power semiconductor element. Moreover, the buried layers 284 and 285 expand upward from the surface of the substrate 282 into the EPI 283. Meanwhile, the P type diffusion layers 286 and 287 expand downward from the surface of the EPI 283. This structure allows lateral diffusion widths W23 and W24 of the buried layers 284 and 285 to be increased with the increase of the upward expansion amounts thereof. Accordingly, this structure has a problem that it is difficult to reduce the size of formation regions of the ISOs 288 and 289.

In the conventional semiconductor device, the EPI 283 is formed on the substrate 282. The NPN transistor 281 is formed in a region defined by the ISOs 288 and 289 in the EPI 283. Moreover, the EPI 283 is a region with a low concentration of the N type impurity. With the alignment accuracy in the above configuration, a formation region of the buried layer 284 or the diffusion layer 291 is shifted, so that a distance L9 between the buried layer 284 and the diffusion layer 291 is shortened. Thus, a region in which a depletion layer expands is reduced in size. Accordingly, in the NPN transistor 281, short-circuit is likely to occur between the base region and each of the ISOs 288 and 289. Thus, the conventional semiconductor device has a problem that it is difficult to obtain desired breakdown voltage characteristics. Moreover, the conventional semiconductor device has another problem that a variation in the distance L9 causes the breakdown voltage characteristics of the NPN transistor 281 to be unstable.

Moreover, in the conventional semiconductor device, it is required to secure a certain distance for the distance L9 between the diffusion layer 291 and the buried layer 284 in order to achieve a desired breakdown voltage of the NPN transistor 281. Similarly, it is also required to secure a certain distance for a distance L10 between the diffusion layers 291 and 286. However, a problem arises that the increase in the lateral diffusion width W23 and also a lateral diffusion width W25 of the buried layer 284 and the diffusion layer 286 makes it difficult to reduce the device size of the NPN transistor 281.

Moreover, in a conventional method of manufacturing the semiconductor device, the above-described two thermal diffusion steps are performed to connect the buried layers 284 and 285 with the diffusion layers 286 and 287, respectively. This manufacturing method allows the lateral diffusion widths W23 and W24 of the buried layers 284 and 285 to be increased with the increase of the upward expansion amounts thereof. Moreover, by the thermal diffusion steps, the N type buried layer 290 also expands toward the surface of the EPI 283. As a result, a problem arises that it is difficult to reduce the size of the formation regions of the ISOs 288 and 289, and also to reduce the device size of the NPN transistor 281.

Description will be further given of a structure in which NPN transistors 301 and 302 are adjacent to each other with an ISO 303 interposed therebetween as shown in FIG. 26. A ground voltage (GND) is applied to a collector region of the NPN transistor 301, and a power supply voltage (Vcc) is applied to a collector region of the NPN transistor 302. In this case, in the NPN transistor 302, a reverse bias is applied to a PN junction region of the P type ISO 303 and a P type semiconductor substrate 304 with an N type EPI 305 and an N type buried layer 306. Moreover, a depletion layer spreads from the PN junction region toward the P type ISO 303 and the P type substrate 304.

In this event, when an impurity concentration in an overlapping region of a P type buried layer 307 and a P type diffusion layer 308 is lowered in the ISO 303, the depletion layer spreads into the NPN transistor 301 as indicated by a dotted line. A problem here is that, when the spreading depletion layer reaches an N type buried layer 309, the collector regions of the NPN transistors 301 and 302 are short-circuited, and thereby, a leak current is caused. In order to prevent the occurrence of leak current, it is required to more widely diffuse the buried layer 307 and the diffusion layer 308 to increase the impurity concentration in the overlapping region. In this case, however, a diffusion width W26 of the buried layer 307 and a diffusion width W27 of the diffusion layer 308 are increased. Thus, a problem arises that it is difficult to reduce the device size of each of the NPN transistors 301 and 302.

SUMMARY OF THE INVENTION

The present invention has been made in consideration of the foregoing circumstances. A semiconductor device according to the present invention includes a one-conductivity type semiconductor substrate, a first opposite-conductivity-type epitaxial layer formed on the semiconductor substrate, a second opposite-conductivity-type epitaxial layer formed on the first epitaxial layer, and a one-conductivity type isolation region which divides the first and second epitaxial layers into a plurality of islands. The isolation region is formed by connecting a first one-conductivity-type buried diffusion layer formed across the semiconductor substrate and the first and second epitaxial layers, a second one-conductivity-type buried diffusion layer formed in the second epitaxial layer, and a first one-conductivity-type diffusion layer formed in the second epitaxial layer with one another.

Moreover, a method of manufacturing a semiconductor device according to the present invention includes providing a one-conductivity type semiconductor substrate, forming a first opposite-conductivity-type epitaxial layer on the semiconductor substrate, forming a second opposite-conductivity-type epitaxial layer on the first epitaxial layer after implanting ions of an impurity for forming a first one-conductivity-type buried diffusion layer into the first epitaxial layer, and forming an isolation region by firstly implanting ions of an impurity for forming a second one-conductivity-type buried diffusion layer from a surface of the second epitaxial layer, then continuously implanting ions of an impurity for forming a one-conductivity type diffusion layer, and finally performing thermal diffusion, so as to connect the first one-conductivity-type buried diffusion layer, the second one-conductivity-type buried diffusion layer and the one-conductivity type diffusion layer with one another.

BRIEF DESCRIPTION OF THE DRAWINGS

FIG. 18A is a cross-sectional view, and FIG. 18B is a plan view, each showing a semiconductor device according to a fifth preferred embodiment of the present invention.

FIG. 19A is a graph showing an impurity concentration and a diffusion depth in an isolation region, and FIG. 19B is a cross-sectional view showing the isolation region, each according to the fifth preferred embodiment of the present invention.

FIG. 23A is a cross-sectional view, and FIG. 23B is a plan view, each showing a semiconductor device according to a seventh preferred embodiment of the present invention.

FIG. 24A is a cross-sectional view showing an isolation region, and FIG. 24B is a view showing the isolation region represented by a concentration distribution, each according to the seventh preferred embodiment of the present invention.

DESCRIPTION OF THE EMBODIMENTS

Figure 1:
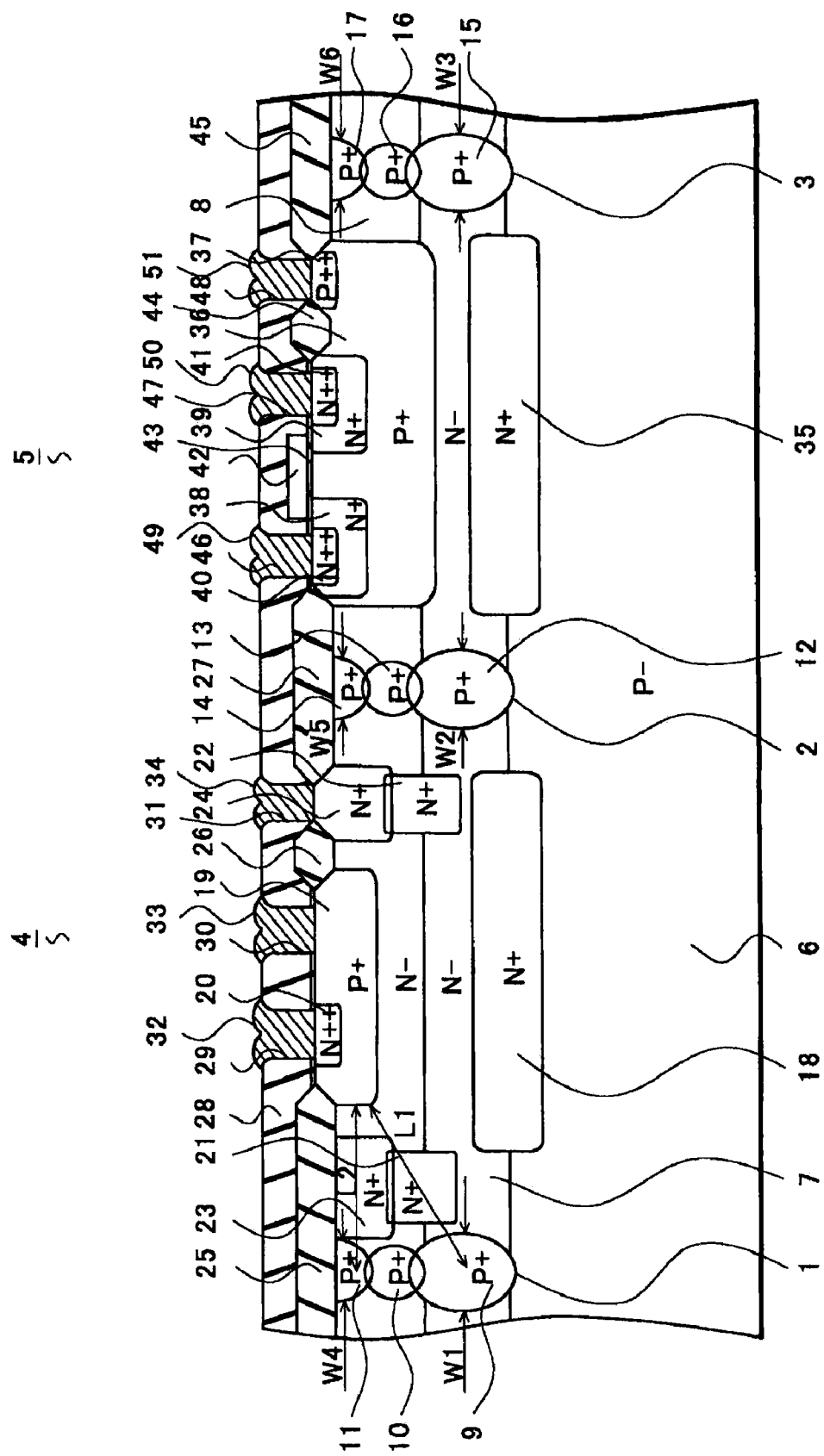
FIG. 1 is a cross-sectional view showing a semiconductor device according to a first preferred embodiment of the present invention.

With reference to FIG. 1, a semiconductor device according to a first preferred embodiment of the present invention will be described below.

As shown in FIG. 1, isolation regions (hereinafter, referred to as ISOs) 1 to 3 are formed in the entire integrated circuit (IC) in a lattice pattern, and various types of semiconductor elements are formed respectively in island regions (hereinafter, referred to as islands) surrounded by the ISOs. As shown in FIG. 1, an NPN transistor 4 is formed in one of the islands while an N channel metal oxide semiconductor (MOS) transistor 5 is formed in another island.

Firstly, as shown in FIG. 1, the ISOs 1 to 3 penetrate first and second N type epitaxial layers (hereinafter, referred to as EPIs) 7 and 8 on a P type single crystal silicon substrate 6, to divide the EPIs 7 and 8 into a plurality of islands. The ISOs 1 to 3 are each formed of three diffusion layers stacked in a snowman-like shape. For example, the ISO 1 is formed of P type buried diffusion layers (hereinafter, referred to as buried layers) 9 and 10 and a P type diffusion layer 11 in this order from the bottom. Similarly, the ISO 2 is formed of P type buried layers 12 and 13 and a P type diffusion layer 14, and the ISO 3 is formed of P type buried layers 15 and 16 and a P type diffusion layer 17. It should be noted that, although the ISOs 1 to 3 are individually shown in the cross section of FIG. 1, the ISOs 1 to 3 are integrally formed so as to surround the islands.

The first EPI 7 is formed on the substrate 6, and the second EPI 8 is formed on the EPI 7.

The P type buried layers 9, 12 and 15 (hereinafter, referred to as L-ISOs 9, 12 and 15) are formed across the substrate 6 and the first and second EPIs 7 and 8. The L-ISOs 9, 12 and 15 are formed by implanting ions of an impurity from a surface of the first EPI 7.

The P type buried layers 10, 13 and 16 (hereinafter, referred to as M-ISOs 10, 13 and 16) are formed in the second EPI 8. The M-ISOs 10, 13 and 16 are connected to the L-ISOs 9, 12 and 15, respectively. The M-ISOs 10, 13 and 16 are formed by implanting ions of an impurity from a surface of the second EPI 8.

The P type diffusion layers 11, 14 and 17 (hereinafter, referred to as U-ISOs 11, 14 and 17) are formed in the second EPI 8. The U-ISOs 11, 14 and 17 are connected to the M-ISOs 10, 13 and 16, respectively. The U-ISOs 11, 14 and 17 are formed by implanting ions of an impurity from the surface of the second EPI 8.

As shown in FIG. 1, in the ISO 1, the M-ISO 10 is disposed between the L-ISO 9 and the U-ISO 11. Then, the M-ISO 10 is connected with the L-ISO 9, which expands upward from the surface of the first EPI 7, and the U-ISO 11, which expands downward from the surface of the second EPI 8. This structure enables reduction in an upward expansion amount of the L-ISO 9 and also significant reduction in a lateral diffusion width W1 of the L-ISO 9. Since a formation region of the ISO 1 is determined according to the lateral diffusion width W1 of the L-ISO 9, the formation region of the ISO 1 is significantly reduced in size.

Similarly, also in the ISOs 2 and 3, diffusion widths W2 and W3 respectively of the L-ISOs 12 and 15 are significantly reduced. Thus, formation regions of the ISOs 2 and 3 are also significantly reduced in size. Moreover, in the ISOs 1 to 3, downward expansion amounts of the U-ISOs 11, 14 and 17 are reduced by forming the M-ISOs 10, 13 and 16. Accordingly, lateral diffusion widths W4 to W6 respectively of the U-ISOs 11, 14 and 17 are reduced.

On the substrate 6, two layers, the EPIs 7 and 8, are deposited. The thickness of the first EPI 7 is, for example, 0.6 μm, while the thickness of the second EPI 8 is, for example, 1.0 μm. With this structure, the thickness of the first EPI 7 is formed thin. Accordingly, the upward expansion amounts of the L-ISOs 9, 12 and 15 are reduced, and hence, the lateral diffusion widths W1 to W3 of the L-ISOs 9, 12 and 15 are significantly reduced. As a result, the formation regions of the ISOs 1 to 3 are significantly reduced.

The NPN transistor 4 is mainly formed of the substrate 6, the first and second EPIs 7 and 8, an N type buried layer 18 used as a collector region, a P type diffusion layer 19 used as a base region, an N type diffusion layer 20 used as an emitter region, N type buried layers 21 and 22, and N type diffusion layers 23 and 24.

The N type buried layers 21 and 22 are formed across the first and second EPIs 7 and 8, and are respectively disposed between the P type diffusion layer 19 and the ISOs 1 and 2.

The N type diffusion layers 23 and 24 are formed in the second EPI 8. The N type diffusion layer 23 is formed so as to connect with the N type buried layer 21. The N type diffusion layer 24 is formed so as to connect with the N type buried layer 22. Moreover, the N type diffusion layers 23 and 24 are respectively disposed between the P type diffusion layer 19 and the ISOs 1 and 2. Although not shown in FIG. 1, the N type diffusion layers 23 and 24 are, for example, circularly arranged so as to surround the P type diffusion layer 19.

LOCOS oxide films (hereinafter, referred to as LOCOSs) 25 to 27 are formed in the EPI 8. Each of the LOCOSs 25 to 27 has a thickness of, for example, approximately 3000 Å to 10000 Å in its flat portion. Below the LOCOSs 25 and 27, the ISOs 1 and 2 are formed, respectively.

An insulating layer 28 is formed on the upper surface of the EPI 8. The insulating layer 28 is formed of a nondoped silicate glass (NSG) film, a boron phosphor silicate glass (BPSG) film or the like. By dry etching, contact holes 29 to 31 are formed in the insulating layer 28.

In the contact holes 29 to 31, aluminum alloy films made of, for example, an Al—Si film, an Al—Si—Cu film, and an Al—Cu film are selectively formed. Thus, an emitter electrode 32, a base electrode 33 and a collector electrode 34 are formed. In this event, the collector electrode 34 is connected to the N type diffusion layer 24 through the contact hole 31. By utilizing the N type diffusion layer 24 and the N type buried layer 22, a sheet resistance value in the collector region is reduced. The emitter electrode 32, the base electrode 33 and the collector electrode 34 may be formed by burying metal plugs such as tungsten (W) in the contact holes 29 to 31 and forming aluminum alloy films thereon.

The N channel MOS transistor 5 is mainly formed of the substrate 6, the first and second EPIs 7 and 8, an N type buried layer 35, a P type diffusion layers 36 and 37 used as a back gate region, N type diffusion layers 38 and 40 used as a source region, N type diffusion layers 39 and 41 used as a drain region, and a gate electrode 42.

The N type buried layer 35 is formed across the substrate 6 and the first EPI 7.

The P type diffusion layer 36 is formed in the first and second EPIs 7 and 8, and is used as the back gate region. The P type diffusion layer 37 is formed so as to overlap with the P type diffusion layer 36, and is used as a back gate lead-out region.

The N type diffusion layers 38 and 39 are formed in the P type diffusion layer 36. The N type diffusion layer 38 is used as the source region, while the N type diffusion layer 39 is used as the drain region. In the N type diffusion layer 38, the N type diffusion layer 40 is formed, and, in the N type diffusion layer 39, the N type diffusion layer 41 is formed. This structure allows the drain region to have a double diffused drain (DDD) structure. The P type diffusion layer 36, positioned between the N type diffusion layers 38 and 39, is used as a channel region. On the upper surface of the EPI 8 used as the channel region, a gate oxide film 43 is formed.

The gate electrode 42 is formed on the upper surface of the gate oxide film 43. The gate electrode 42 is formed of, for example, a polysilicon film and a tungsten silicide film so as to have a desired thickness. Although not shown in FIG. 1, a silicon oxide film is formed on the upper surface of the tungsten silicide film.

The LOCOSs 27, 44 and 45 are formed in the EPI 8.

The insulating layer 28 is formed on the upper surface of the EPI 8. Then, contact holes 46 to 48 are formed in the insulating layer 28 by dry etching.

In the contact holes 46 to 48, aluminum alloy films are selectively formed in the same manner as described above, and thus a source electrode 49, a drain electrode 50 and a back gate electrode 51 are formed, respectively. It should be noted that the source electrode 49, the drain electrode 50 and the back gate electrode 51 may be formed by burying metal plugs, made of, for example, tungsten (W), in the contact holes 46 to 48 and forming aluminum alloy films thereon.

Although described in detail later in description of the method of manufacturing a semiconductor device, dedicated thermal diffusion steps for diffusing the L-ISOs 9, 12 and 15, the M-ISOs 10, 13 and 16, and the U-ISOs 11, 14 and 17, respectively, are omitted. Especially by omitting the dedicated thermal diffusion step for diffusing the L-ISOs 9, 12 and 15, upward expansion amounts of the N type buried layers 18 and 35 are reduced. Thereby, the thickness of each of the EPIs 7 and 8 can be reduced.

Figure 25:
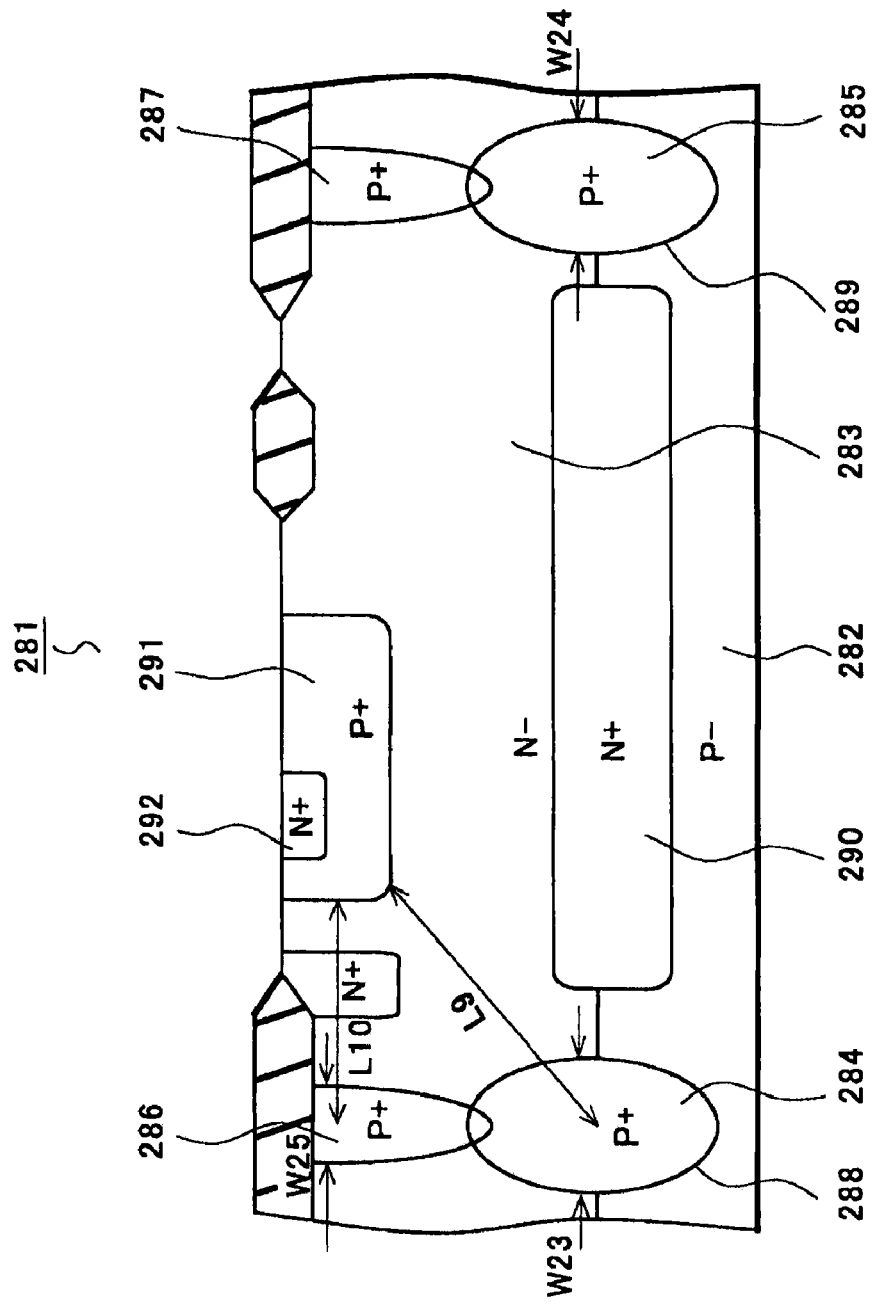
FIG. 25 is a cross-sectional view showing a semiconductor device according to a conventional embodiment.
Figure 26:
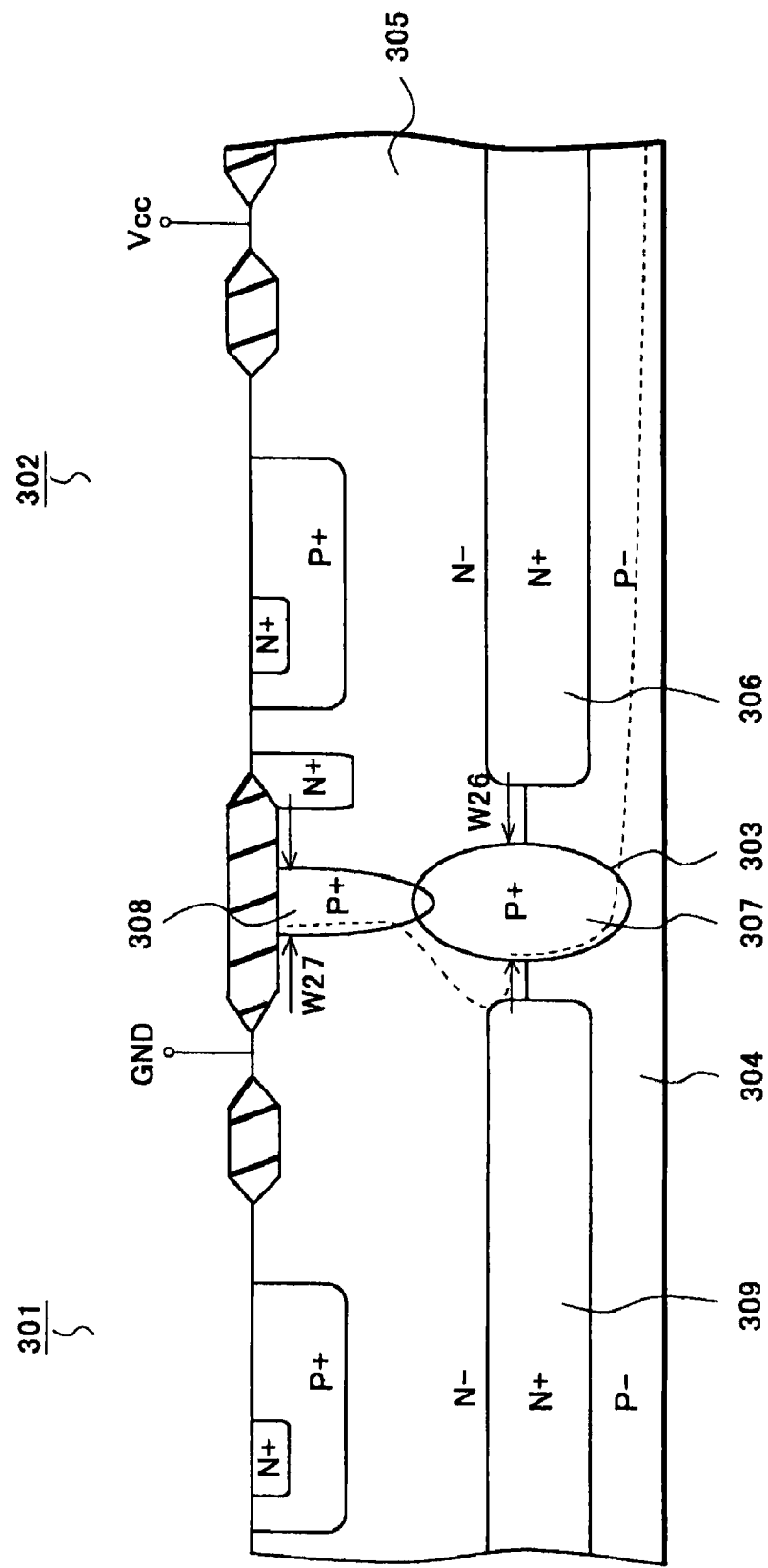
FIG. 26 is a cross-sectional view showing a semiconductor device according to a conventional embodiment.

In the conventional structure, the thickness of the EPI 283 (see FIG. 25) is 2.1 μm, for example. In this embodiment, by contrast, the total thickness of the first and second EPIs 7 and 8 is set to be 1.6 μm, for example. Specifically, by reducing the thickness of the first EPI 7 and also the lateral diffusion width W1 of the L-ISO 9, a distance L1 between the P type diffusion layer 19 and the L-ISO 9 can be shortened. Moreover, as described above, by reducing the lateral diffusion width W4 of the U-ISO 11, a distance L2 between the P type diffusion layer 19 and the U-ISO 11 can be shortened. In the conventional structure, the distance L9 (see FIG. 25) between the P type diffusion layer 291 (see FIG. 25) and the P type buried layer 284 (see FIG. 25) is, for example, 1.7 μm, and the distance L10 (see FIG. 25) between the P type diffusion layer 291 and the P type diffusion layer 286 (see FIG. 25) is, for example, 2.0 μm. In this embodiment, by contrast, the distance L1 is set to be, for example, 1.32 μm, and the distance L2 is set to be, for example, 1.58 μm. As a result, it is possible to shorten the distances between the base region and the ISOs while maintaining the breakdown voltage characteristics of the NPN transistor 4. Thus, the device size of the NPN transistor 4 is reduced.

In addition, as described above, the N type buried layer 21 and the N type diffusion layer 23 connected to each other are disposed between the P type diffusion layer 19 and the P type ISO 1, and the N type buried layer 22 and the N type diffusion layer 24 connected to each other are disposed between the P type diffusion layer 19 and the P type ISO 2. By providing the connected N type buried layer 21 and diffusion layer 23 as well as the connected N type buried layer 22 and diffusion layer 24, impurity concentrations are increased in regions in the EPIs 7 and 8, the regions being between the P type diffusion layer 19 and the P type ISOs 1 and 2, respectively. With this structure, spreading of a depletion layer which spreads toward the N type EPI 8 from a PN junction region between the P type diffusion layer 19 and the N type EPI 8 is suppressed. Similarly, spreading of both a depletion layer which spreads toward the N type EPIs 7 and 8 from a PN junction region between the P type ISOs 1 and 2 and the N type EPIs 7 and 8 is also suppressed. Spreading of the depletion layers described above is thus controlled by the connected N type buried layer 21 and diffusion layer 23 as well as the connected N type buried layer 22 and diffusion layer 24. This makes short-circuit less likely to occur between the base region and each of the ISOs, and consequently, the breakdown voltage characteristics of the NPN transistor 4 are improved.

In this embodiment, description has been given of the case where only the M-ISOs 10, 13 and 16 are disposed respectively between the L-ISOs 9, 12 and 15 and the U-ISOs 11, 14 and 17 in the ISO 1 to 3. However, the preferred embodiment of the present invention is not limited to this case. For example, multiple P type buried layers may be disposed between each of the above pairs of the L-ISO and the U-ISO.

Moreover, in this embodiment, various design changes in arrangement regions of the connected N type buried layer 21 and diffusion layer 23 and the connected N type buried layer 22 and diffusion layer 24 can be made in accordance with the breakdown voltage characteristics of the NPN transistor 4. For example, the connected N type buried layer 21 and diffusion layer 23 and the connected N type buried layer 22 and diffusion layer 24 do not always have to be disposed in regions where desired breakdown voltage characteristics are secured by the distances between the P type diffusion layer 19 and the P type ISOs 1 and 2. In other words, it is only necessary to dispose the connected N type buried layer 21 and diffusion layer 23 and the connected N type buried layer 22 and diffusion layer 24 at least in regions where the distances between the P type diffusion layer 19 and the P type ISOs 1 and 2 are short. Besides the above, various changes can be made without departing from the scope of the present invention.

Next, a semiconductor device according to a second preferred embodiment of the present invention will be described with reference to FIG. 2.

Figure 2:
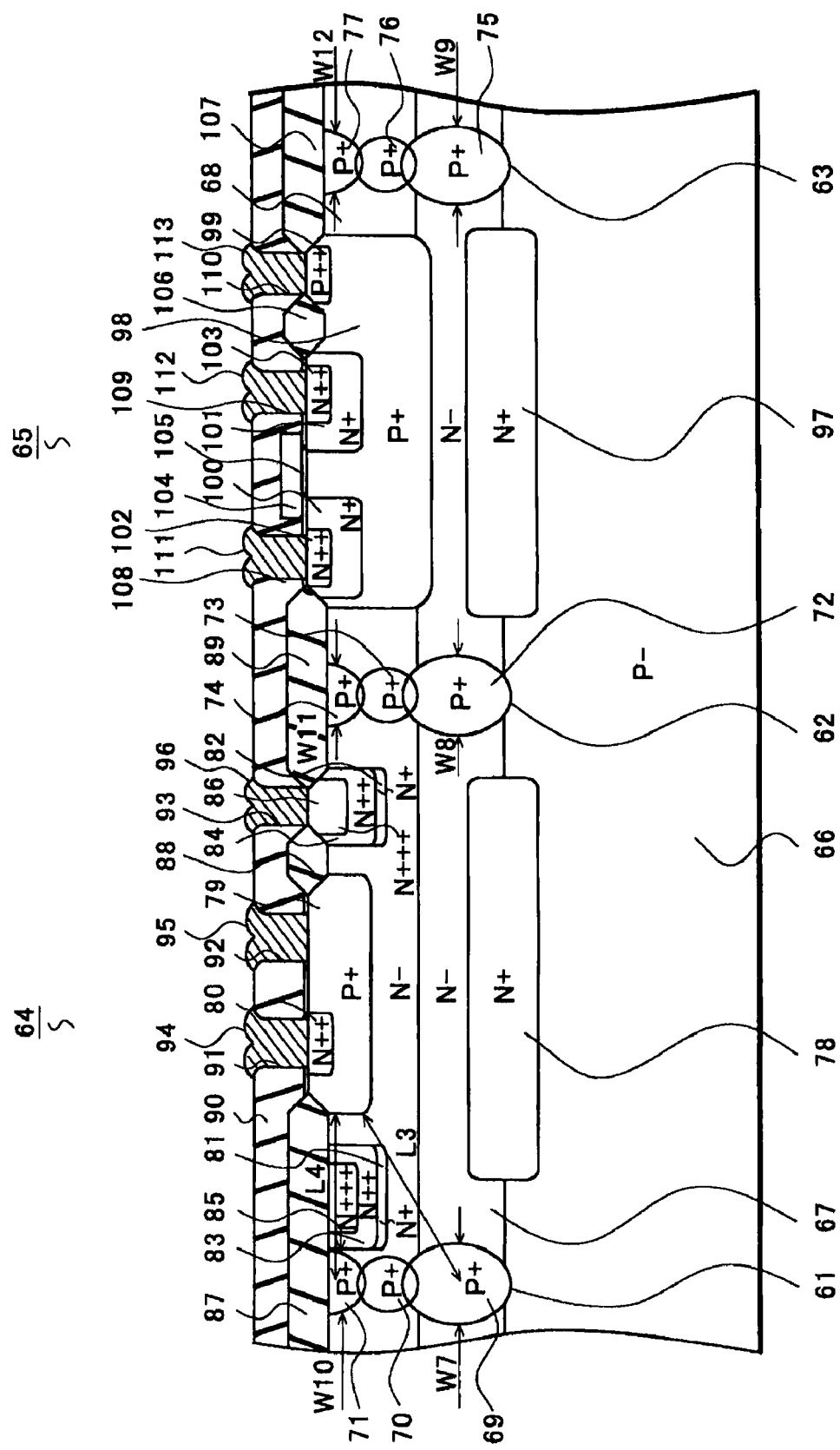
FIG. 2 is a cross-sectional view showing a semiconductor device according to a second preferred embodiment of the present invention.

As shown in FIG. 2, an NPN transistor 64 is formed in one of islands partitioned with ISOs 61 to 63, and an N channel MOS transistor 65 is formed in another island. Although not shown in FIG. 2, a P channel MOS transistor, a PNP transistor and the like are formed in the other islands.

Firstly, as shown in FIG. 2, the ISOs 61 to 63 penetrate first and second N type EPIs 67 and 68, formed on a P type single crystal silicon substrate 66, to divide the EPIs 67 and 68 into a plurality of islands, as in the first preferred embodiment. The ISO 61 is formed of a P type buried layer 69 (hereinafter, referred to as an L-ISO 69), a P type buried layer 70 (hereinafter, referred to as an M-ISO 70) and a P type diffusion layer 71 (hereinafter, referred to as a U-ISO 71). Similarly, the ISO 62 is formed of P type buried layers 72 and 73 (hereinafter, referred to as an L-ISO 72 and an M-ISO 73, respectively) and a P type diffusion layer 74 (hereinafter, referred to as a U-ISO 74), and the ISO 63 is formed of P type buried layers 75 and 76 (hereinafter, referred to as an L-ISO 75 and an M-ISO 76, respectively) and a P type diffusion layer 77 (hereinafter, referred to as a U-ISO 77).

The first EPI 67 is formed on the substrate 66, and the second EPI 68 is formed on the first EPI 67.

The L ISOs 69, 72 and 75 are formed across the substrate 66 and the first and second EPIs 67 and 68.

The M-ISOs 70, 73 and 76 are formed in the second EPI 68. The M-ISOs 70, 73 and 76 are connected to the L-ISOs 69, 72 and 75, respectively.

The U-ISOs 71, 74 and 77 are formed in the second EPI 68. The U-ISOs 71, 74 and 77 are connected to the M-ISOs 70, 73 and 76, respectively.

As shown in FIG. 2, in the ISO 61, the M-ISO 70 is disposed between the L-ISO 69 and the U-ISO 71. Then, the M-ISO 70 is connected with the L-ISO 69, which expands upward from a surface of the EPI 67, and the U-ISO 71, which expands downward from a surface of the EPI 68.

This structure enables reduction in an upward expansion amount of the L-ISO 69 and also significant reduction in a lateral diffusion width W7 of the L-ISO 69. Since a formation region of the ISO 61 is determined according to the lateral diffusion width W7 of the L-ISO 69, the formation region of the ISO 61 is significantly reduced in size. Similarly, also in the ISOs 62 and 63, diffusion widths W8 and W9 respectively of the L-ISOs 72 and 75 are significantly reduced. Thus, formation regions of the ISOs 62 and 63 are also significantly reduced in size. Moreover, lateral diffusion widths W10 to W12 respectively of the U-ISOs 71, 74 and 77 are reduced.

On the substrate 66, two layers, the EPIs 67 and 68, are deposited. The thickness of the first EPI 67 is, for example, 0.6 μm, while the thickness of the second EPI 68 is, for example, 1.0 µm. With this structure, the thickness of the first EPI 67 is formed thin. Accordingly, the upward expansion amounts of the L-ISOs 69, 72 and 75 are reduced, and hence, the lateral diffusion widths W 7 to W9 respectively of the L-ISOs 69, 72 and 75 are reduced significantly. As a result, the formation regions of the ISOs 61 to 63 are reduced significantly.

The NPN transistor 64 is mainly formed of the substrate 66, the EPIs 67 and 68, an N type buried layer 78 used as a collector region, a P type diffusion layer 79 used as a base region, an N type diffusion layer 80 used as an emitter region, and N type diffusion layers 81 to 86.

The N type diffusion layers 81 to 86 are formed in the second EPI 68. The N type diffusion layers 81, 83 and 85 are formed so as to overlap with one another, and the N type diffusion layers 82, 84 and 86 are formed so as to overlap with one another. Moreover, the N type diffusion layers 81, 83 and 85 and the N type diffusion layers 82, 84 and 86 are respectively disposed between the P type diffusion layer 79 and the ISOs 61 and 62. Although not shown in FIG. 2, the N type diffusion layers 81 and 82 are, for example, circularly arranged so as to surround the P type diffusion layer 79. Similarly, the N type diffusion layers 83 and 84 as well as the N type diffusion layers 85 and 86 are circularly arranged so as to surround the P type diffusion layer 79.

LOCOSs 87 to 89 are formed in the EPI 68. Below the LOCOSs 87 and 89, the P type ISOs 61 and 62 are formed.

An insulating layer 90 is formed on the upper surface of the EPI 68. The insulating layer 90 is formed of an NSG film, a BPSG film, or the like. By dry etching, contact holes 91 to 93 are formed in the insulating layer 90.

As in the first preferred embodiment, aluminum alloy films are selectively formed in the contact holes 91 to 93, and thus, an emitter electrode 94, a base electrode 95 and a collector electrode 96 are formed. In this event, the collector electrode 96 is connected to the N type diffusion layer 86 through the contact hole 93. By utilizing the N type diffusion layers 82, 84 and 86, a sheet resistance value in the collector region is reduced.

The N channel MOS transistor 65 is mainly formed of the substrate 66, the EPIs 67 and 68, an N type buried layer 97, P type diffusion layers 98 and 99 used as a back gate region, N type diffusion layers 100 and 102 used as a source region, N type diffusion layers 101 and 103 used as a drain region, and a gate electrode 104.

The N type buried layer 97 is formed across the substrate 66 and the EPI 67.

The P type diffusion layer 98 is formed in the EPIs 67 and 68, and is used as the back gate region. The P type diffusion layer 99 is formed so as to overlap with the P type diffusion layer 98, and is used as a back gate lead-out region.

The N type diffusion layers 100 and 101 are formed in the P type diffusion layer 98. The N type diffusion layer 100 is used as the source region, while the N type diffusion layer 101 is used as the drain region. In the N type diffusion layer 100, the N type diffusion layer 102 is formed, and, in the N type diffusion layer 101, the N type diffusion layer 103 is formed. This structure allows the drain region to have a DDD structure. The P type diffusion layer 98, positioned between the N type diffusion layers 100 and 101, is used as a channel region. On the upper surface of the EPI 68 used as the channel region, a gate oxide film 105 is formed.

The gate electrode 104 is formed on the upper surface of the gate oxide film 105. The gate electrode 104 is formed of, for example, a polysilicon film and a tungsten silicide film so as to have a desired thickness. Although not shown in FIG. 2, a silicon oxide film is formed on the upper surface of the tungsten silicide film.

The LOCOSs 89, 106 and 107 are formed in the EPI 68.

The insulating layer 90 is formed on the upper surface of the EPI 68. Then, contact holes 108 to 110 are formed in the insulating layer 90 by dry etching.

In the contact holes 108 to 110, aluminum alloy films are selectively formed, and then a source electrode 111, a drain electrode 112 and a back gate electrode 113 are respectively formed.

Although described in detail later in description of a method of manufacturing a semiconductor device, dedicated thermal diffusion steps for diffusing the L-ISOs 69, 72 and 75, the M-ISOs 70, 73 and 76, and the U-ISOs 71, 74 and 77, respectively, are omitted. Especially by omitting the dedicated thermal diffusion step for diffusing the L-ISOs 69, 72 and 75, upward expansion amounts of the N type buried layers 78 and 97 are reduced. Thereby, the thickness of each of the EPIs 67 and 68 can be reduced.

In the conventional structure, the thickness of the EPI 283 (see FIG. 25) is 2.1 µm, for example. In this embodiment, by contrast, the total thickness of the first and second EPIs 67 and 68 is set to be 1.6 µm, for example. Specifically, by reducing the thickness of the first EPI 67 and also the lateral diffusion width W7 of the L-ISO 69, a distance L3 between the P type diffusion layer 79 and the L-ISO 69 can be shortened. Moreover, as described above, by reducing the lateral diffusion width W10 of the U-ISO 71, a distance L4 between the P type diffusion layer 79 and the U-ISO 71 can be shortened.

In the conventional structure, the distance L9 (see FIG. 25) between the P type diffusion layer 291 (see FIG. 25) and the P type buried layer 284 (see FIG. 25) is, for example 1.7 µm, and the distance L10 (see FIG. 25) between the P type diffusion layer 291 and the P type diffusion layer 286 (see FIG. 25) is, for example, 2.0 µm. In this embodiment, by contrast, the distance L3 is set to be, for example, 1.23 µm, and the distance L4 is set to be, for example, 1.55 µm. As a result, it is possible to shorten the distance between the base region and each of the ISOs while maintaining the breakdown voltage characteristics of the NPN transistor 64. Thus, the device size of the NPN transistor 64 is reduced.

In addition, as described above, the N type diffusion layers 81, 83 and 85 and the N type diffusion layers 82, 84 and 86 are respectively disposed between the P type diffusion layer 79 and the P type ISOs 61 and 62. By providing the N type diffusion layers 81 to 86, impurity concentrations are increased in regions in the EPIs 67 and 68, the regions being between the P type diffusion layer 79 and the P type ISOs 61 and 62. With this structure, spreading of a depletion layer which spreads toward the N type EPI 68 from a PN junction region between the P type diffusion layer 79 and the N type EPI 68 is suppressed. Similarly, spreading of both a depletion layer which spreads toward the N type EPIs 67 and 68 from a PN junction region between the P type ISOs 61 and 62 and the N type EPIs 67 and 68 is also suppressed. Spreading of the depletion layers described above is thus controlled by the N type diffusion layer 81 to 86. This makes short-circuit less likely to occur between the base region and each of the ISOs, and consequently, the breakdown voltage characteristics of the NPN transistor 64 are improved.

In this embodiment, description has been given of the case where only the M-ISOs 70, 73 and 76 are disposed respectively between the L-ISOs 69, 72, and 75 and the U-ISOs 71, 74 and 77 in the ISOs 61 to 63. However, the preferred embodiment of the present invention is not limited to the above case. For example, multiple P type buried layers may be disposed between each of the above pairs of the L-ISO and the U-ISO.

Moreover, in this embodiment, various design changes in arrangement regions of the N type diffusion layers 81 to 86 can be made in accordance with the breakdown voltage characteristics of the NPN transistor 64. For example, the N type diffusion layers 81 to 86 do not always have to be disposed in regions where desired breakdown voltage characteristics are secured by the distances between the P type diffusion layer 79 and the P type ISOs 61 and 62. In other words, it is only necessary to dispose the N type diffusion layers 81 to 86 at least in regions where the distances between the P type diffusion layer 79 and the P type ISO 61, 62 are short.

In addition, in this embodiment, description has been given of the case where the N type diffusion layers 81, 83 and 85 are formed to overlap with one another, and where the N type diffusion layers 82, 84 and 86 are also formed to overlap with one another. However, the preferred embodiment of the present invention is not limited to the above case. For example, the preferred embodiment of the present invention may also be applied to a case where only the N type diffusion layers 81 and 82 are provided. Alternatively, the NPN transistor 64 may have a double diffusion structure in which the N type diffusion layers 81 and 83 are formed to overlap with each other, and in which the N type diffusion layers 82 and 84 are formed to overlap with each other. The NPN transistor 64 may also have a multiple diffusion structure, such as a quadruple diffusion structure, in which more diffusion layers are formed to overlap with each other. Besides the above, various changes may be made without departing from the scope of the present invention.

Next, a method of manufacturing a semiconductor device according to a third preferred embodiment of the present invention will be described below with reference to FIGS. 3 to 9. The method of manufacturing a semiconductor device shown in FIGS. 3 to 9 is a method of manufacturing the semiconductor device shown in FIG. 1. Thus, the same constituent components are denoted by the same reference numerals.

Figure 3:
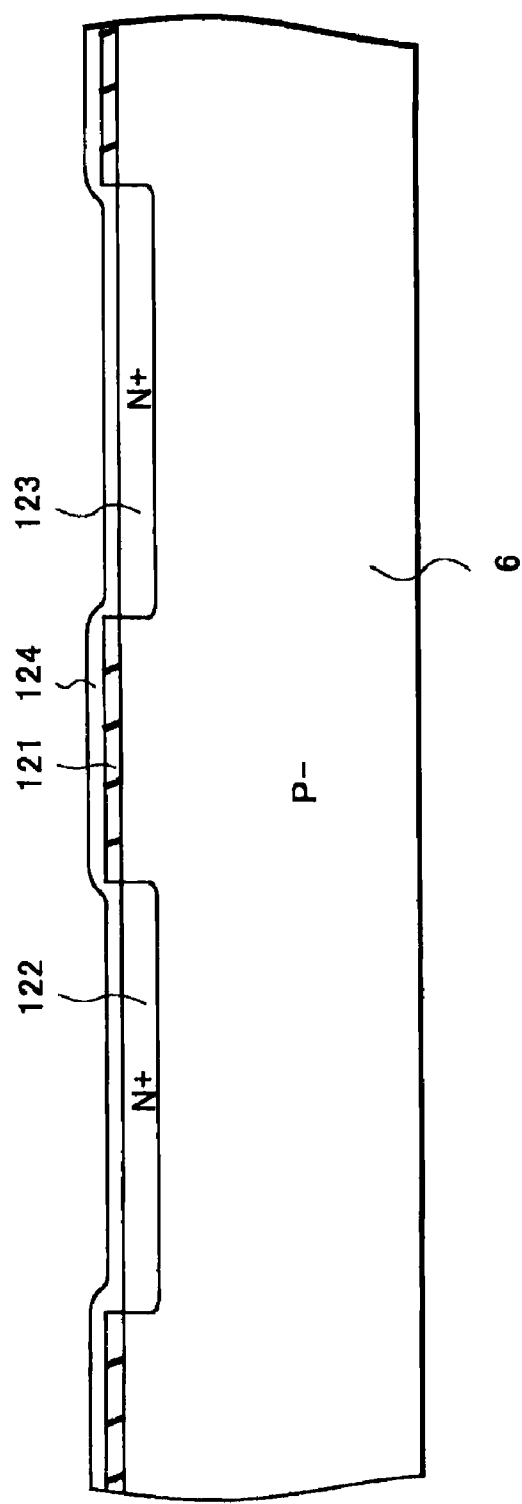
FIG. 3 is a cross-sectional view showing a method of manufacturing a semiconductor device according to a third preferred embodiment of the present invention.

Firstly, as shown in FIG. 3, a P type single crystal silicon substrate 6 is provided. A silicon oxide film 121 is formed on the substrate 6, and the silicon oxide film 121 is selectively removed so as to form openings on formation regions of N type buried layers 122 and 123. Thereafter, by using the silicon oxide film 121 as a mask, a liquid source 124 containing an N type impurity such as antimony (Sb) is applied onto a surface of the substrate 6. Subsequently, after the antimony (Sb) is thermally diffused to form the N type buried layers 122 and 123, the silicon oxide film 121 and the liquid source 124 are removed.

Figure 4:
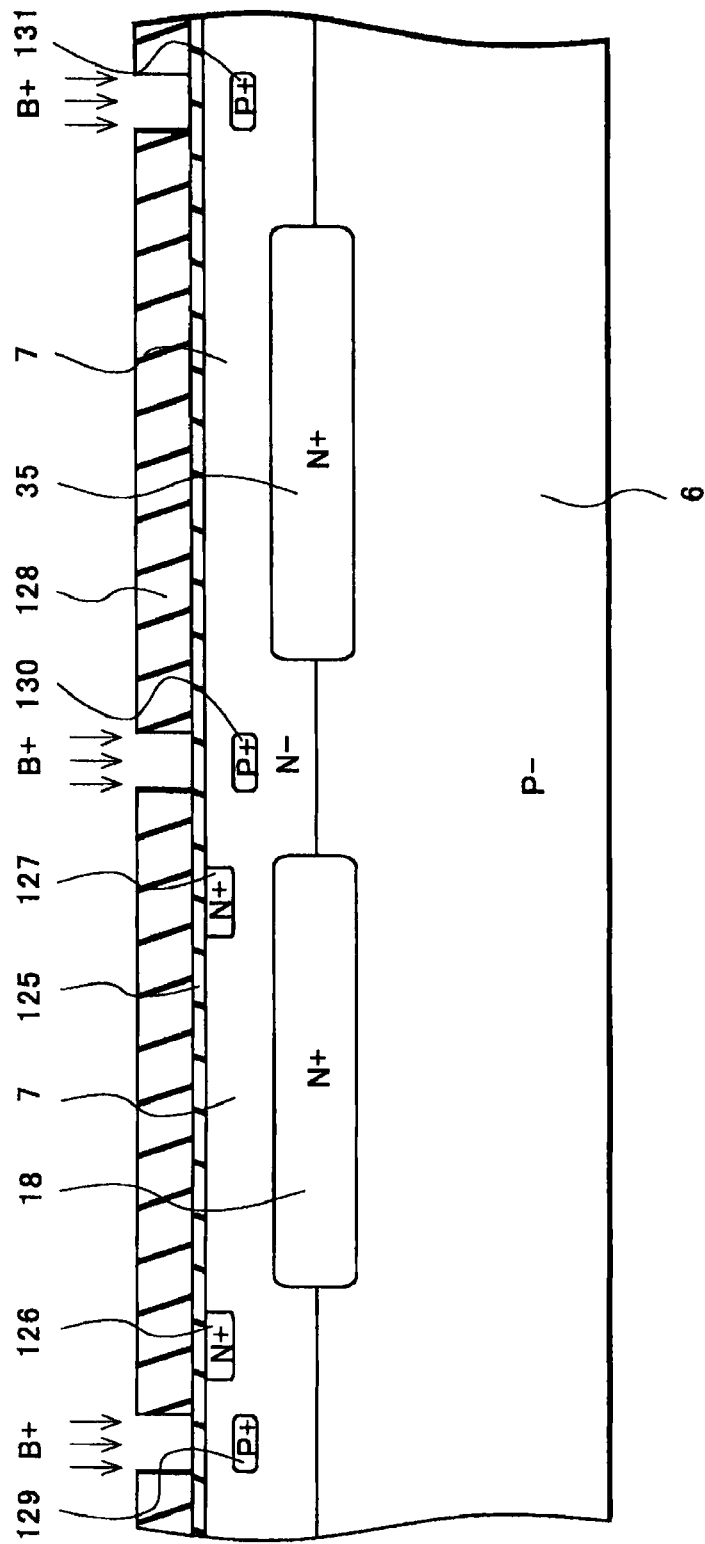
FIG. 4 is a cross-sectional view showing the method of manufacturing a semiconductor device according to the third preferred embodiment of the present invention.

Then, as shown in FIG. 4, a first N type EPI 7 is formed on the substrate 6 so as to have a thickness of approximately 0.5 µm to 0.7 µm. By heat treatment in the step of forming the EPI 7, the N type buried layers 122 and 123 (see FIG. 3) are thermally diffused to form N type buried layers 18 and 35.

Next, a silicon oxide film 125 is formed on the EPI 7, and then, N type diffusion layers 126 and 127 are formed by use of an ion implantation technique. Thereafter, a photoresist 128 is formed on the silicon oxide film 125, and openings are formed, on regions where P type buried layers 129 to 131 are to be formed, in the photoresist 128. Subsequently, ions of a P type impurity such as boron (B+) are implanted from a surface of the EPI 7, and then, the photoresist 128 and the silicon oxide film 125 are removed.

Figure 5:
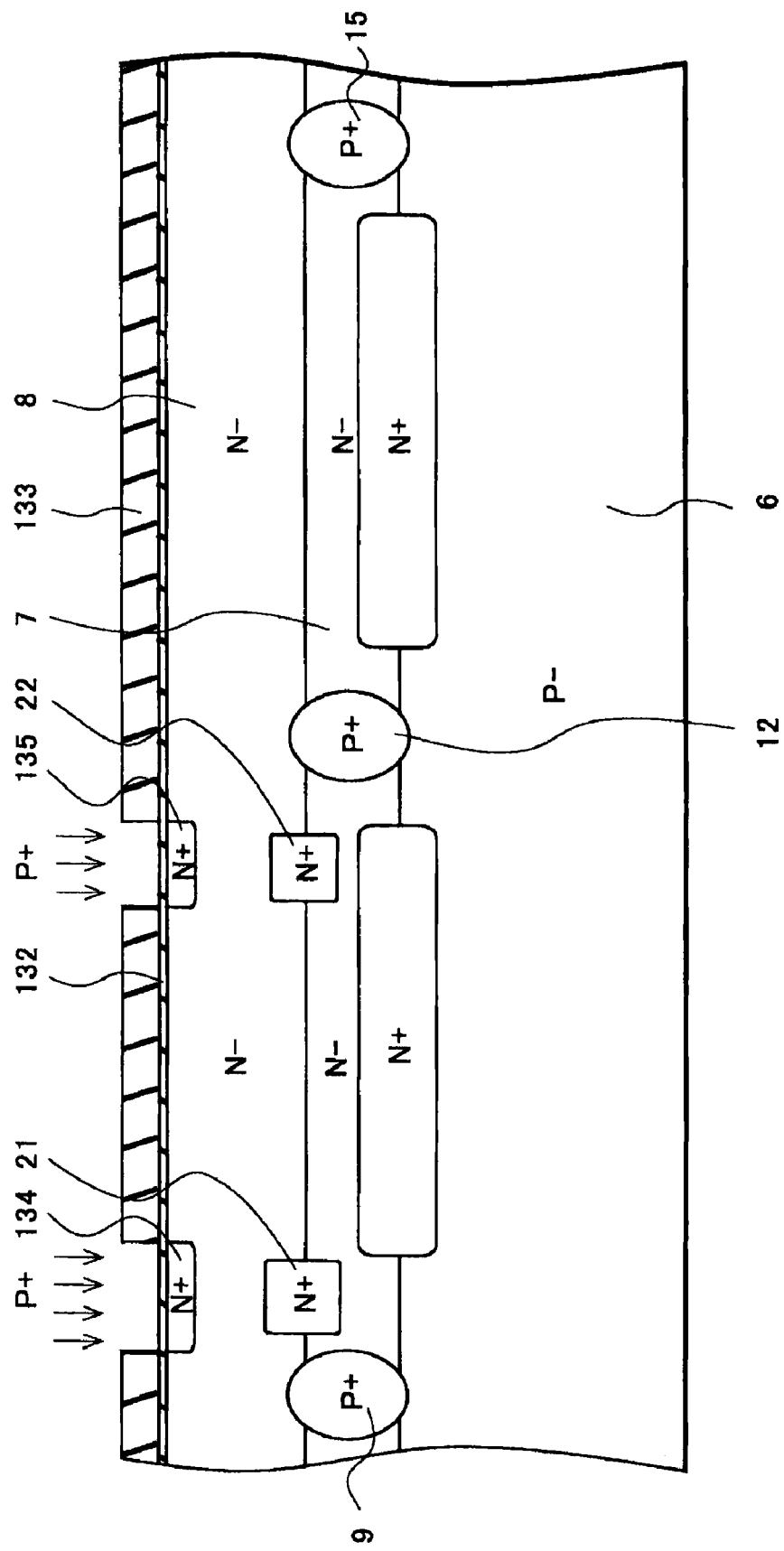
FIG. 5 is a cross-sectional view showing the method of manufacturing a semiconductor device according to the third preferred embodiment of the present invention.

Next, as shown in FIG. 5, an second N type EPI 8 is formed on the EPI 7 so as to have a thickness of approximately 0.9 µm to 1.1 µm. By heat treatment in the step of forming the EPI 8, the N type buried layers 126 and 127 (see FIG. 4) and the P type buried layers 129, 130 and 131 (see FIG. 4) are thermally diffused to form N type buried layers 21 and 22 as well as the L-ISOs 9, 12 and 15.

Thereafter, a silicon oxide film 132 is formed on the EPI 8, and then, a photoresist 133 is formed on the silicon oxide film 132. Subsequently, openings are formed, on regions where N type diffusion layers 134 and 135 are to be formed, in the photoresist 133. Then, ions of an N type impurity such as phosphorus (P+) are implanted from a surface of the EPI 8.

Figure 6:
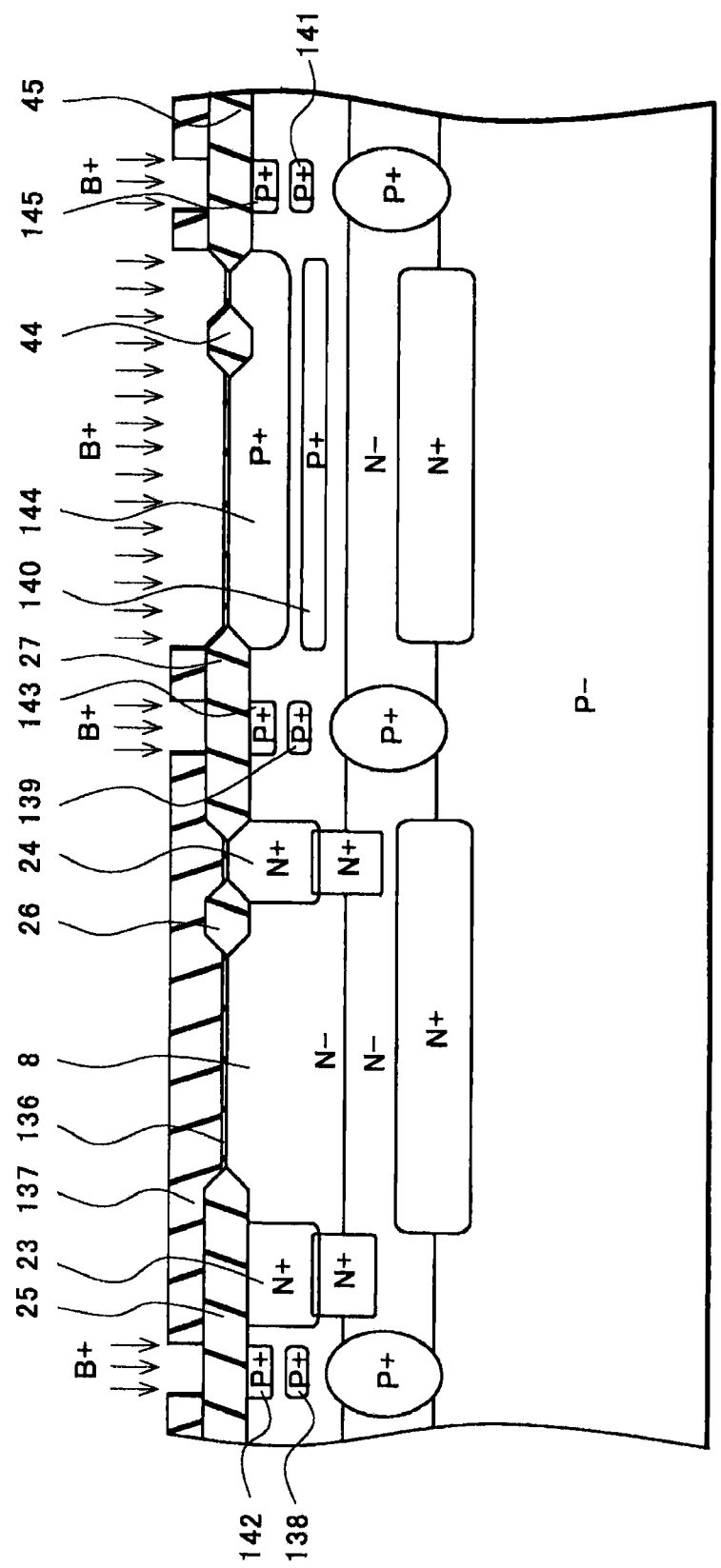
FIG. 6 is a cross-sectional view showing the method of manufacturing a semiconductor device according to the third preferred embodiment of the present invention.

Next, as shown in FIG. 6, the photoresist 133 (see FIG. 5) is removed, and thermal diffusion is performed. Then, after N type diffusion layers 23 and 24 are formed, the silicon oxide film 132 (see FIG. 5) is removed. Then, LOCOSs 25 to 27, 44 and 45 are formed in desired regions of the EPI 8. On the upper surface of the EPI 8, a silicon oxide film 136 is formed, and then, a photoresist 137 is formed on the silicon oxide film 136. Thereafter, openings are formed, on regions where P type buried layers 138 to 141 are to be formed, in the photoresist 137. Subsequently, ions of a P type impurity such as boron (B++) are implanted from the surface of the EPI 8.

Then, second ion implantation is performed by use of the same photoresist 137 without thermally diffusing the P type buried layers 138 to 141. Specifically, ions of a P type impurity such as boron (B+) are implanted from above the photoresist 137. By this second ion implantation step, P type diffusion layers 142 to 145 are formed. Thus, in this embodiment, dedicated thermal diffusion steps for thermally diffusing the P type buried layers 138 to 141 and the P type diffusion layers 142 to 145 are omitted.

Here, after the LOCOSs 25, 27, 44 and 45 are formed, boron ions (B++, B+) are implanted from above the LOCOSs 25, 27, 44 and 45. This manufacturing method makes it possible to prevent occurrence of crystal defects caused by heat in formation of the LOCOSs 25, 27, 44 and 45 from the surface of the EPI 8 damaged by the implantation of boron ions (B++, B+) having a relatively large molecular size. Specifically, by the implantation of boron ions after the formation of the LOCOSs 25, 27, 44 and 45, the heat in the formation of the LOCOSs 25, 27, 44 and 45 can be prevented from being applied to the damaged region.

Figure 7:
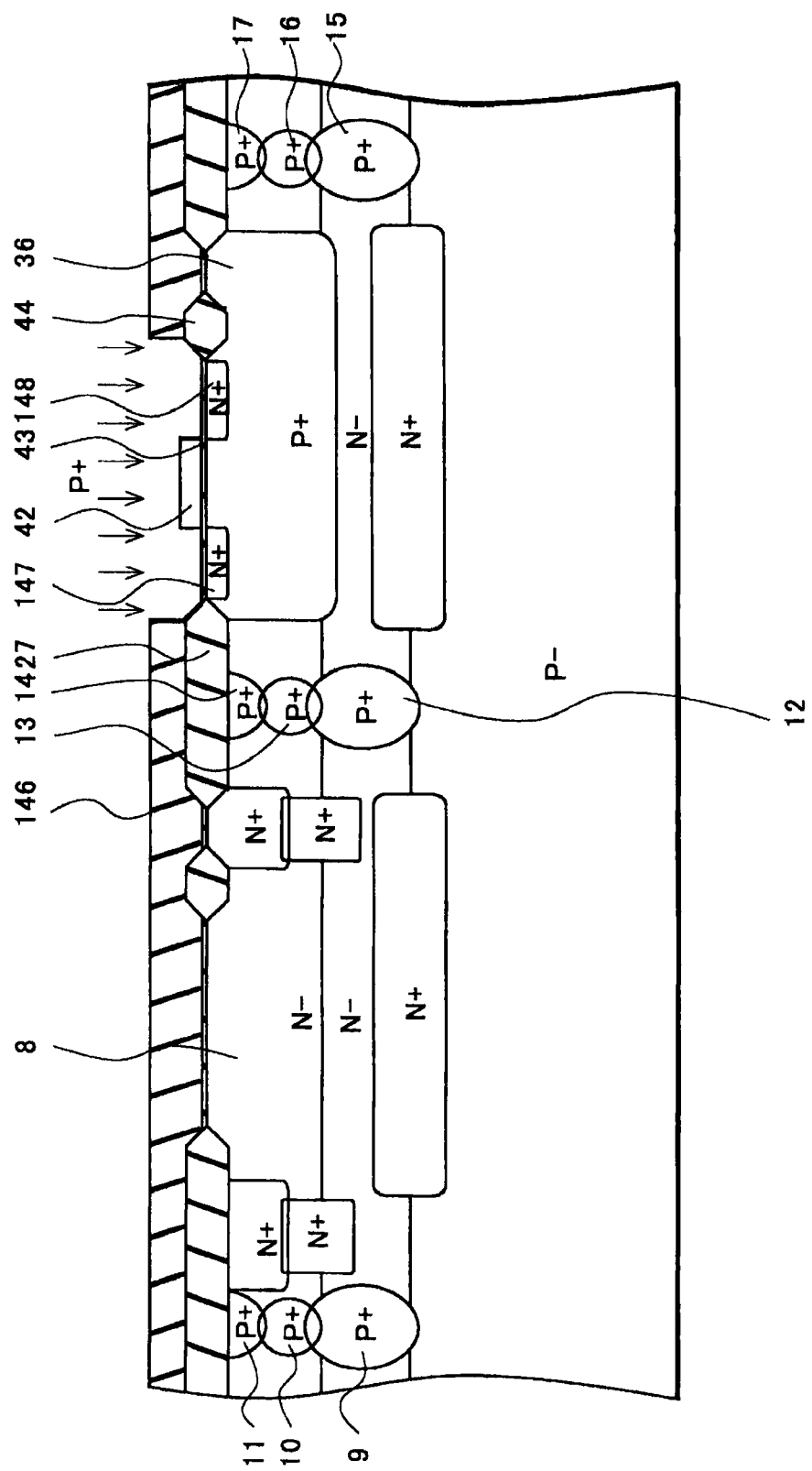
FIG. 7 is a cross-sectional view showing the method of manufacturing a semiconductor device according to the third preferred embodiment of the present invention.

Next, as shown in FIG. 7, the photoresist 137 (see FIG. 6) is removed, and thermal diffusion is performed. Then, after M-ISOs 10, 13 and 16, U-ISOs 11, 14 and 17, and P type diffusion layer 36 are formed, the silicon oxide film 136 (see FIG. 6) is removed. In the following description, the P type buried layer 140 (see FIG. 6) and the P type diffusion layer 144 (see FIG. 6) are connected by thermal diffusion to form the P type diffusion layer 36.

As described above, the second ion implantation step is continuously performed after the first ion implantation step without performing any dedicated thermal diffusion step for thermally diffusing the P type buried layers 138 to 141. Thereafter, the above thermal diffusion step is performed. By use of this manufacturing method, the M-ISOs 10, 13 and 16, the U-ISOs 11, 14 and 17, and the P type diffusion layer 36 are formed in the single thermal diffusion step. Specifically, by omitting dedicated thermal diffusion steps for thermally diffusing the P type buried layers 138 to 141 and the P type diffusion layers 142 to 145 after the first and second ion implantation steps, lateral diffusion widths W1 to W3 of the L-ISOs 9, 12 and 15 (see FIG. 1) can be reduced, and consequently, the formation regions of the ISOs 1 to 3 (see FIG. 1) can also be reduced in size.

Furthermore, in the first ion implantation step, the ion implantation is performed at a higher accelerating voltage than that in the second ion implantation step. Moreover, the M-ISOs 10, 13 and 16 are formed near the L-ISOs 9, 12 and 15. This manufacturing method makes it possible to surely connect the M-ISOs 10, 13 and 16 and the L-ISOs 9, 12 and 15, respectively, while reducing upward expansion amounts of the L-ISOs 9, 12 and 15.

In addition, by setting a low impurity concentration in each of the L-ISOs 9, 12 and 15, the lateral diffusion widths W1 to W3 of the L-ISOs 9, 12 and 15 can be reduced, and hence, the formation regions of the ISOs 1 to 3 can be reduced in size. Similarly, by reducing downward expansion amounts of the U-ISOs 11, 14 and 17, lateral diffusion widths W4 to W6 (see FIG. 1) of the U-ISOs 11, 14 and 17 can be reduced.

Thereafter, a gate oxide film 43 is formed on the EPI 8, and then, a gate electrode 42 formed of, for example, a polysilicon film and a tungsten silicide film is formed on the gate oxide film 43. Subsequently, a photoresist 146 is formed on a silicon oxide film used as the gate oxide film 43. Then, openings are formed, on regions where N type diffusion layers 147 and 148 are to be formed, in the photoresist 146. From the surface of the EPI 8, ions of an N type impurity such as phosphorus (P+) are implanted. In this event, by utilizing the LOCOSs 27 and 44 and the gate electrode 42 as masks, the N type diffusion layers 147 and 148 are formed with a high positional accuracy. Thereafter, the photoresist 146 is removed, and thermal diffusion is performed. It should be noted that the N type diffusion layers 147 and 148 are thermally diffused by the thermal diffusion step to form N type diffusion layers 38 and 39 (see FIG. 8), respectively.

Figure 8:
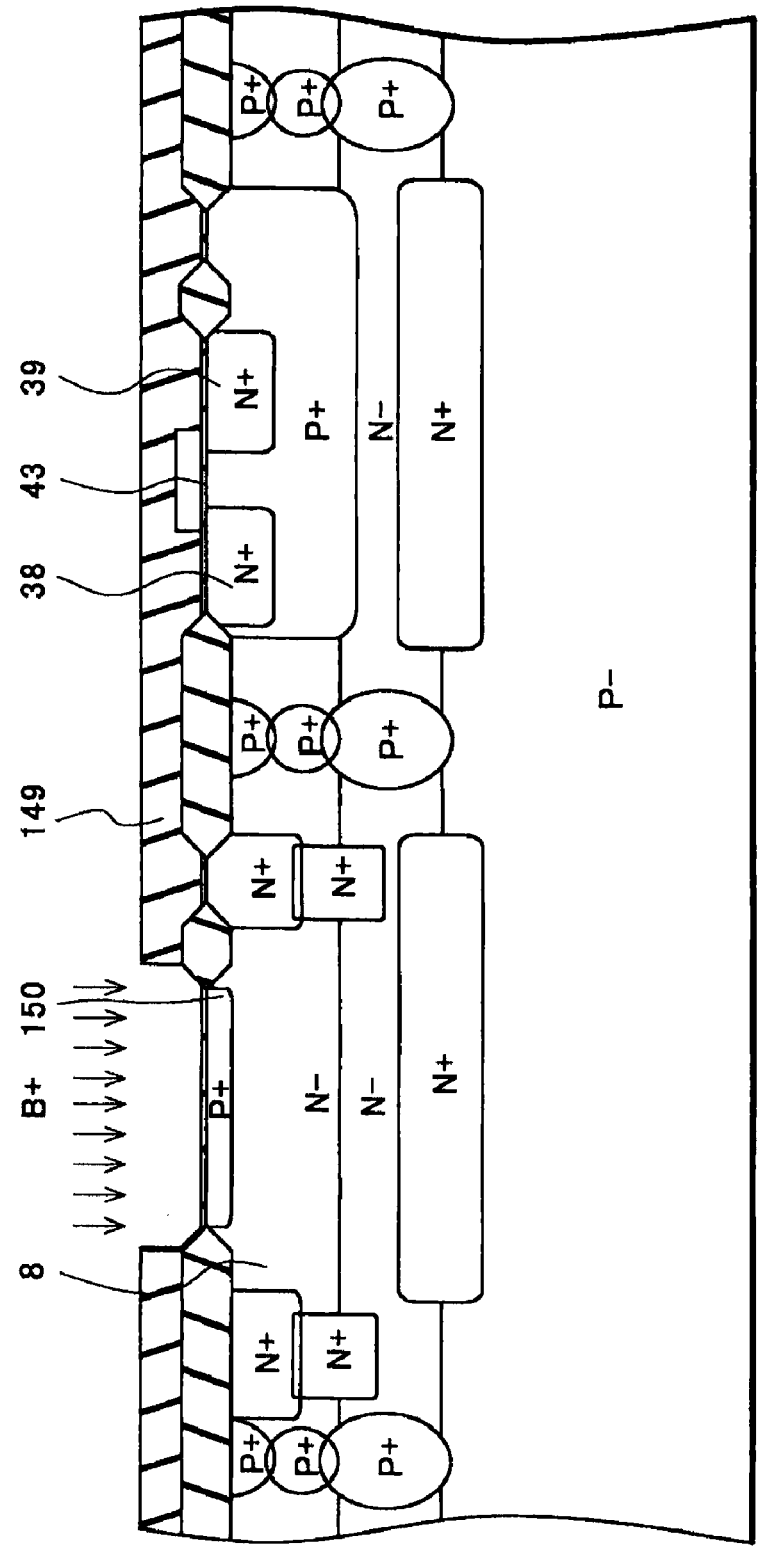
FIG. 8 is a cross-sectional view showing the method of manufacturing a semiconductor device according to the third preferred embodiment of the present invention.

Next, as shown in FIG. 8, a photoresist 149 is formed on the gate oxide film 43. Then, opening is formed, on regions where a P type diffusion layer 150 is to be formed, in the photoresist 149. From the surface of the EPI 8, ions of a P type impurity such as boron (B) are implanted. Thereafter, the photoresist 149 is removed, and thermal diffusion is performed. It should be noted that the P type diffusion layer 150 is thermally diffused by the thermal diffusion step to form a P type diffusion layer 19 (see FIG. 9).

Figure 9:
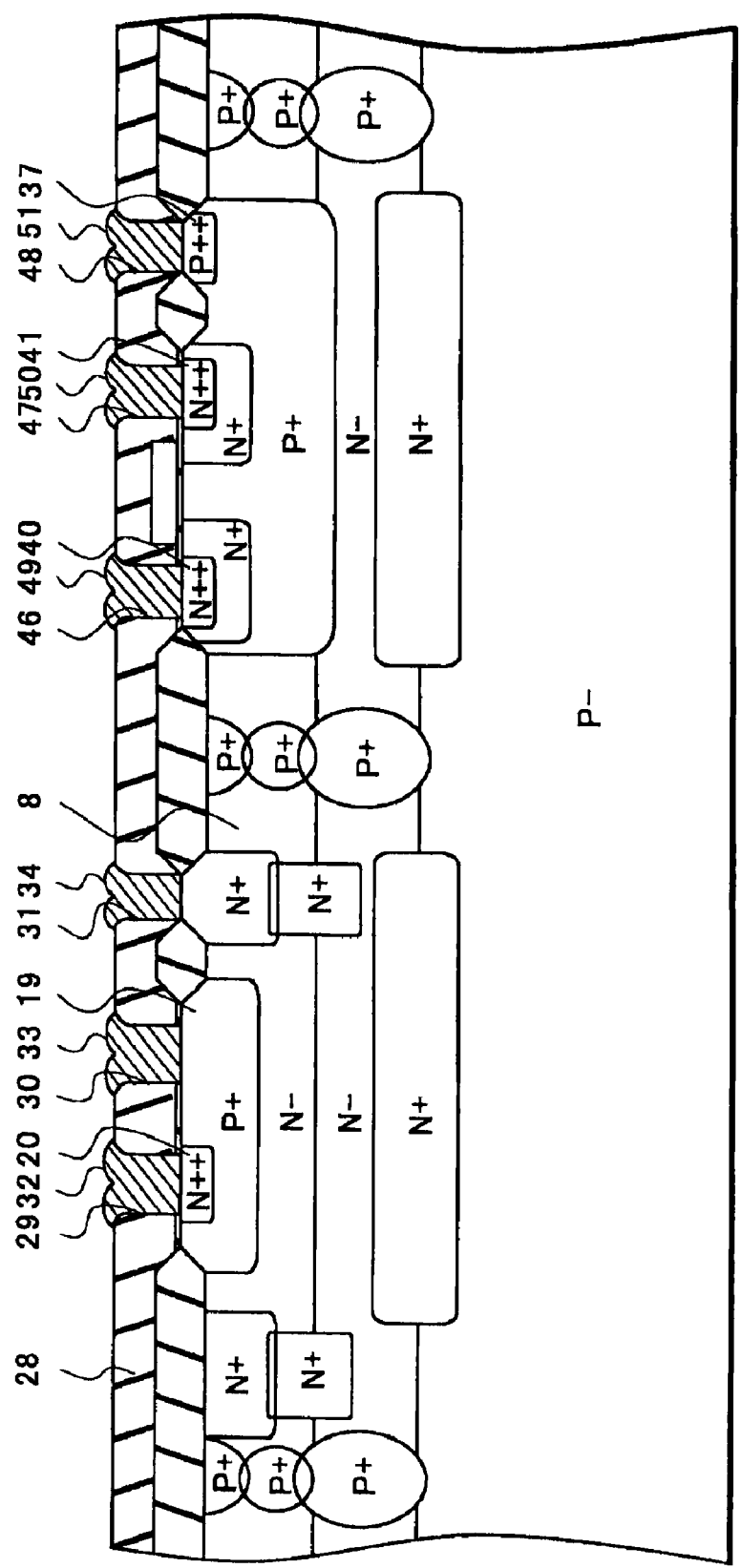
FIG. 9 is a cross-sectional view showing the method of manufacturing a semiconductor device according to the third preferred embodiment of the present invention.

Lastly, as shown in FIG. 9, after N type diffusion layers 20, 40 and 41 are formed, a P type diffusion layer 37 is formed. Thereafter, on the EPI 8, for example, an NSG film, and a BPSG film are deposited as an insulating layer 28. Subsequently, contact holes 29 to 31 and 46 to 48 are formed in the insulating layer 28 by dry etching. In the contact holes 29 to 31 and 46 to 48, aluminum alloy films made of, for example, an Al—Si film, an Al—Si—Cu film, and an Al—Cu film are selectively formed. Thus, an emitter electrode 32, a base electrode 33, a collector electrode 34, a source electrode 49, a drain electrode 50 and a back gate electrode 51 are formed.

In this embodiment, description has been given of the case where the two ion implantation steps are continuously performed by use of the same resist mask from above the LOCOSs 25 to 27, 44 and 45 in formation of the diffusion layers which forms the ISOs. However, the preferred embodiment of the present invention is not limited to the above case. For example, the preferred embodiment of the present invention may also be applied to the case where three or more ion implantation steps are continuously performed by use of the same resist mask from above the LOCOSs 25 to 27, 44 and 45, and where multiple P type buried layers are formed respectively between the L-ISOs 9, 12 and 15 and the U-ISO 11, 14 and 17. Besides the above, various changes can be made without departing from the scope of the present invention.

Next, a method of manufacturing a semiconductor device according to a fourth preferred embodiment of the present invention will be described with reference to FIGS. 10 to 17. The method of manufacturing a semiconductor device shown in FIGS. 10 to 17 is a method of manufacturing the semiconductor device shown in FIG. 2. Thus, the same constituent components are denoted by the same reference numerals.

Figure 10:
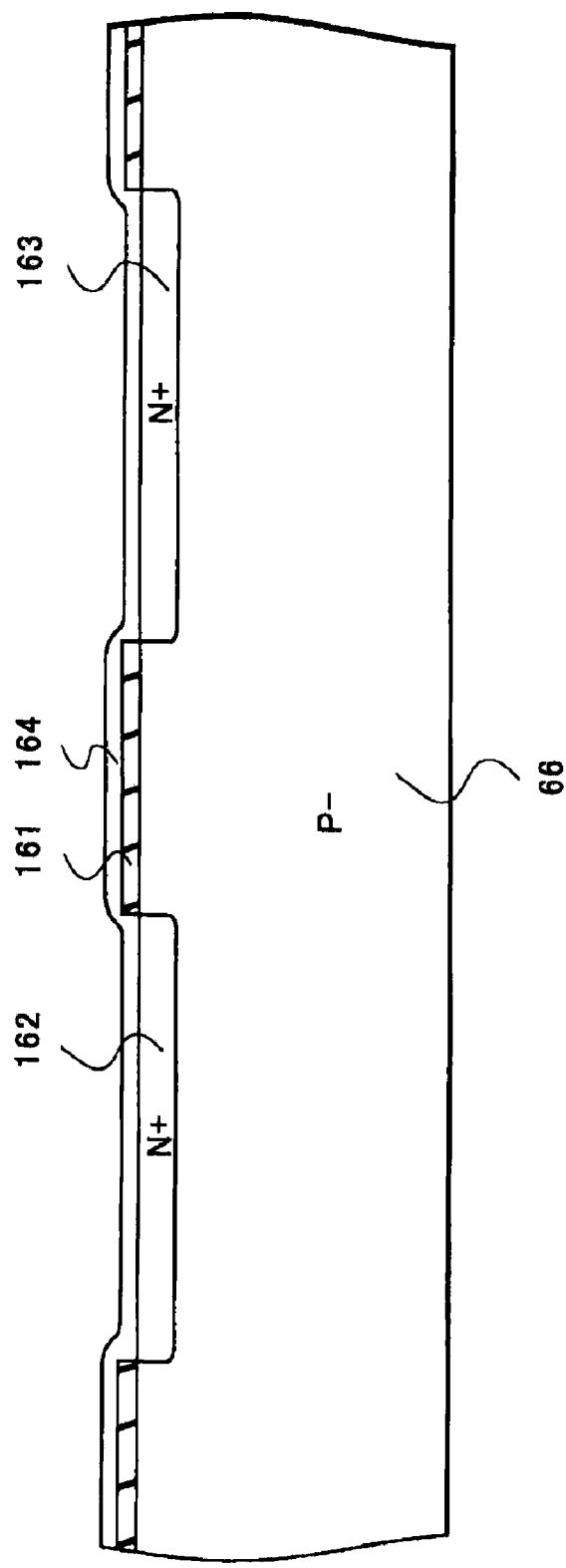
FIG. 10 is a cross-sectional view showing a method of manufacturing a semiconductor device according to a fourth preferred embodiment of the present invention.

Firstly, as shown in FIG. 10, a P type single crystal silicon substrate 66 is provided. A silicon oxide film 161 is formed on the substrate 66, and the silicon oxide film 161 is selectively removed so as to form openings on formation regions of N type buried layers 162 and 163. Thereafter, by using the silicon oxide film 161 as a mask, a liquid source 164 containing an N type impurity such as antimony (Sb) is applied onto a surface of the substrate 66. Subsequently, after the antimony (Sb) is thermally diffused to form the N type buried layers 162 and 163, the silicon oxide film 161 and the liquid source 164 are removed.

Figure 11:
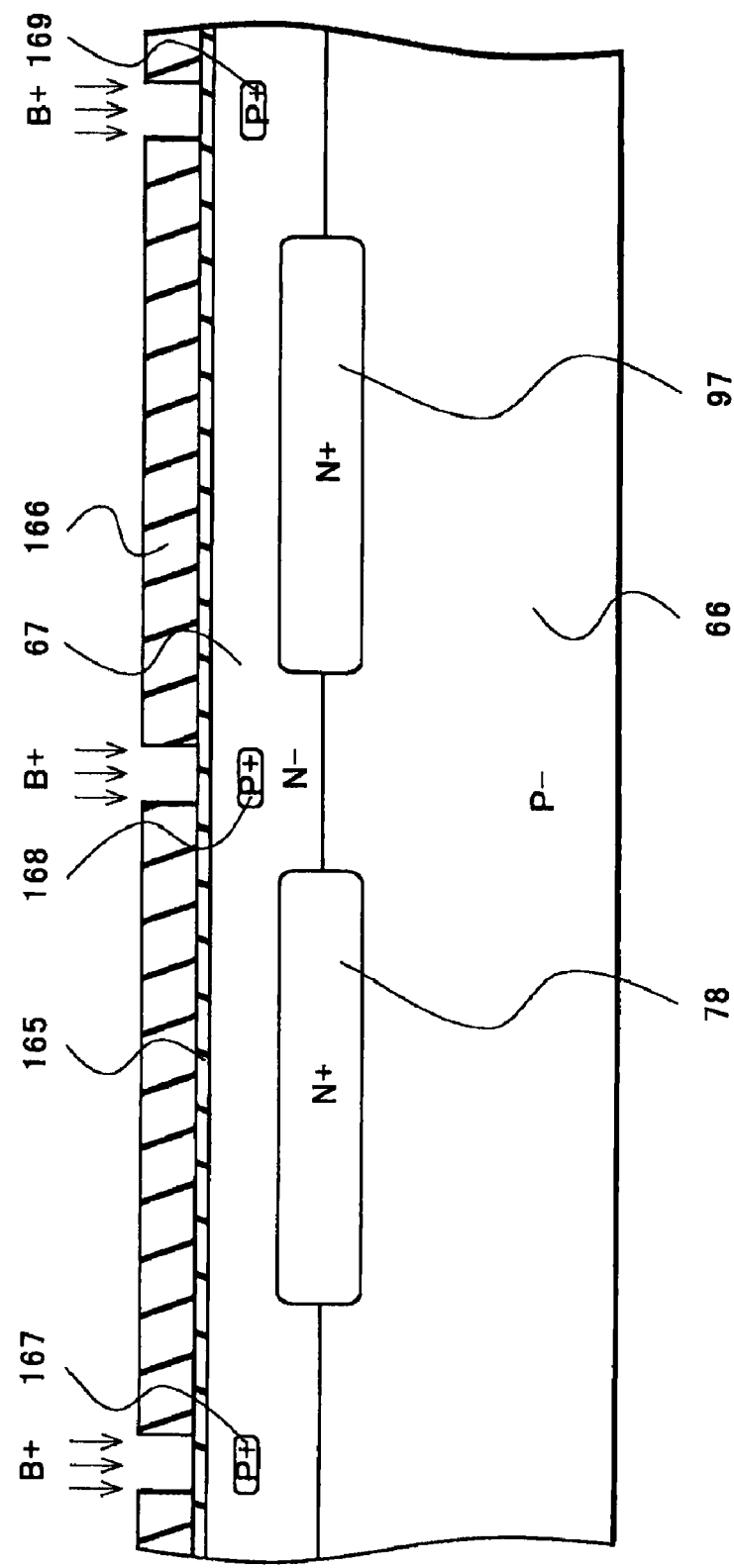
FIG. 11 is a cross-sectional view showing the method of manufacturing a semiconductor device according to the fourth preferred embodiment of the present invention.

Then, as shown in FIG. 11, a first N type EPI 67 is formed on the substrate 66 so as to have a thickness of approximately 0.5 µm to 0.7 µm. By heat treatment in the step of forming the EPI 67, the N type buried layers 162 and 163 (see FIG. 10) are thermally diffused to form N type buried layers 78 and 97.

Next, a silicon oxide film 165 is formed on the EPI 67, and then, a photoresist 166 is formed on the silicon oxide film 165. Thereafter, openings are formed, on regions where P type buried layers 167 to 169 are to be formed, in the photoresist 166. Subsequently, ions of a P type impurity such as boron (B++) are implanted from a surface of the EPI 67, and then, the photoresist 166 and the silicon oxide film 165 are removed.

Figure 12:
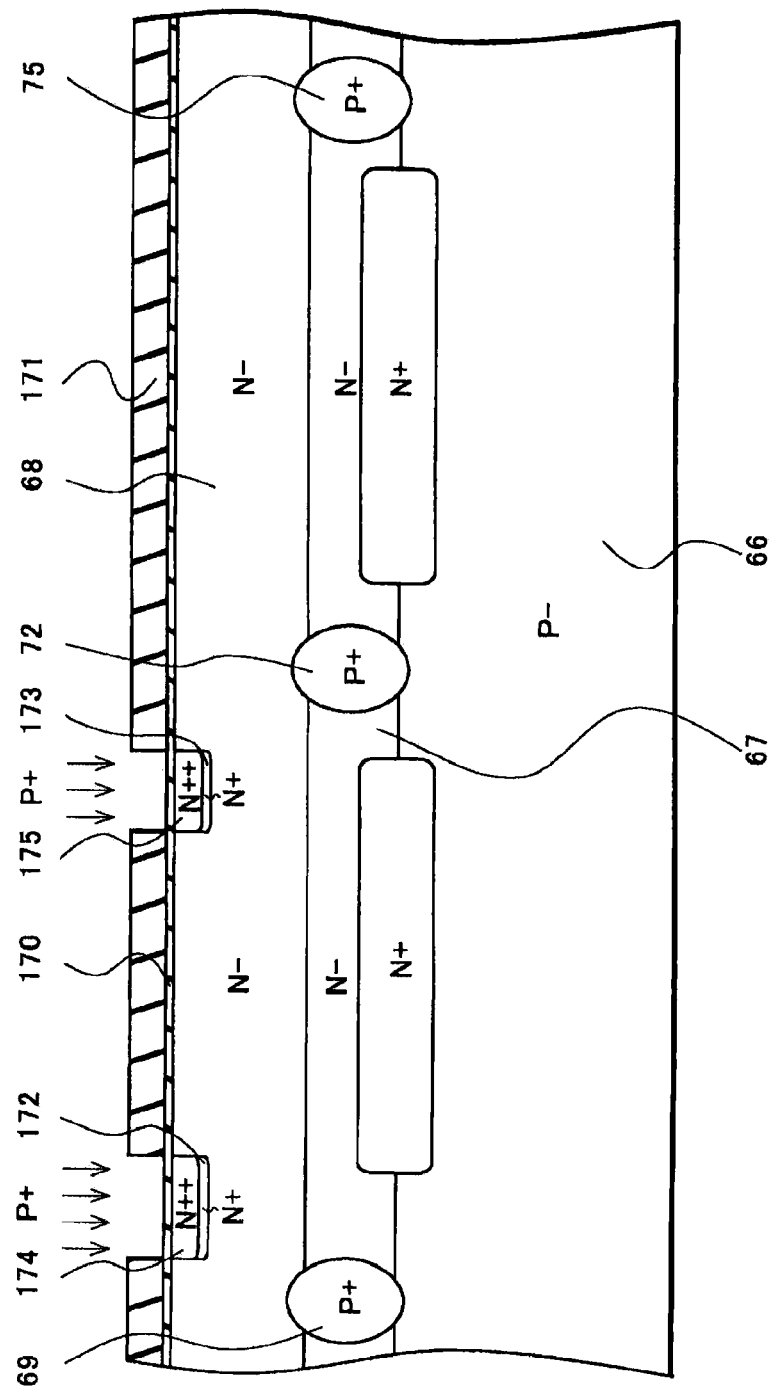
FIG. 12 is a cross-sectional view showing the method of manufacturing a semiconductor device according to the fourth preferred embodiment of the present invention.

Next, as shown in FIG. 12, a second N type EPI 68 is formed on the EPI 67 so as to have a thickness of approximately 0.9 µm to 1.1 µm. By heat treatment in the step of forming the EPI 68, the P type buried layers 167 to 169 (see FIG. 11) are thermally diffused to form L-ISOs 69, 72 and 75.

Thereafter, a silicon oxide film 170 is formed on the EPI 68, and then, a photoresist 171 is formed on the silicon oxide film 170. Subsequently, openings are formed, on regions where N type diffusion layers 172 to 175 are to be formed, in the photoresist 171. Thereafter, firstly, ions of an N type impurity such as phosphorus (P+) are implanted from a surface of the EPI 68 to form the N type diffusion layers 172 and 173, and continuously, ions of an N type impurity such as phosphorus (P+) are implanted from the surface of the EPI 68 to form the N type diffusion layers 174 and 175. Subsequently, the photoresist 171 is removed, and the silicon oxide film 170 is removed after thermal diffusion is performed. By the above thermal diffusion step, the N type diffusion layers 172 to 175 are thermally diffused, and then, N type diffusion layers 81 to 84 (see FIG. 13) are formed.

Figure 13:
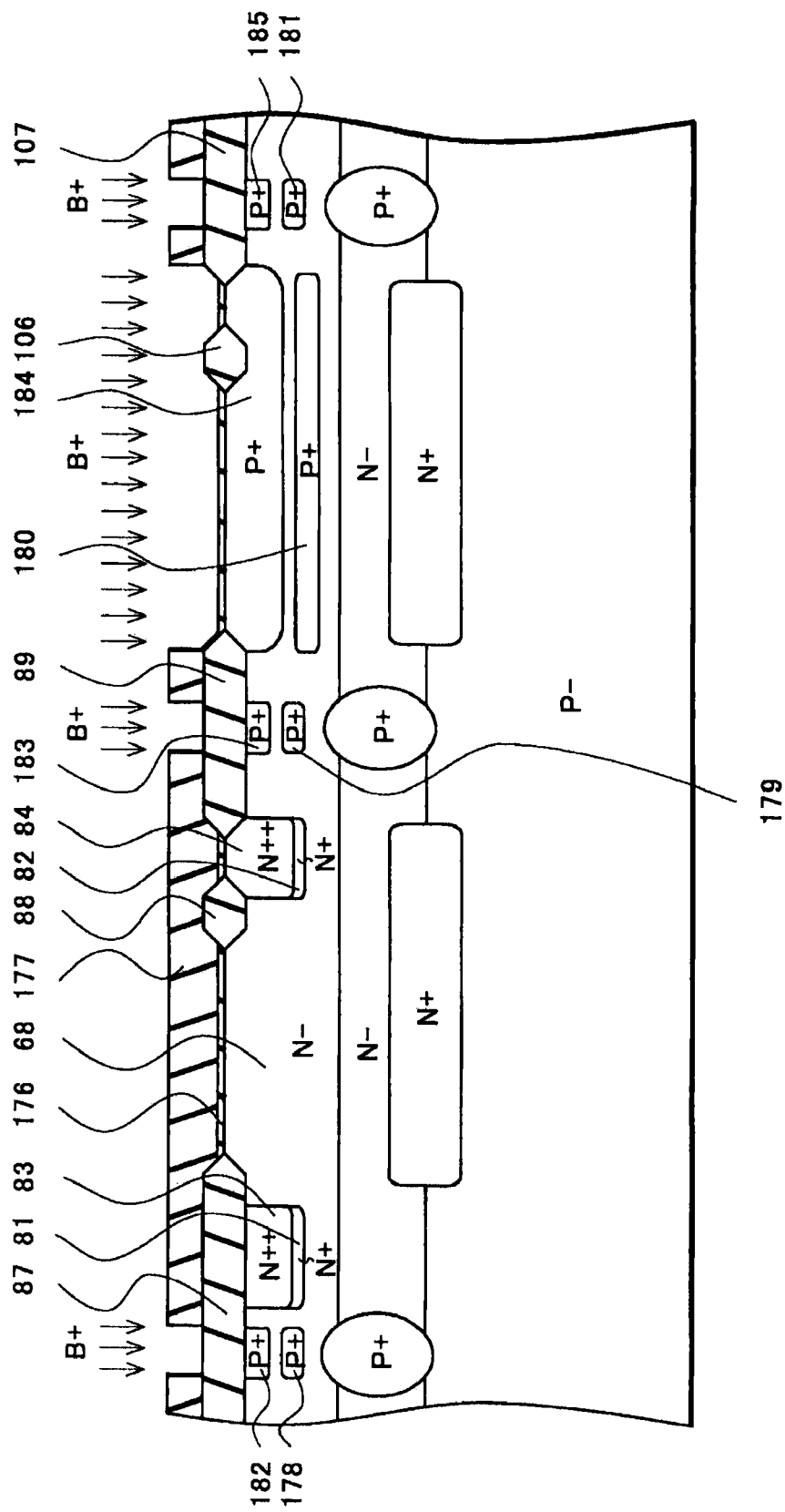
FIG. 13 is a cross-sectional view showing the method of manufacturing a semiconductor device according to the fourth preferred embodiment of the present invention.

Next, as shown in FIG. 13, LOCOSs 87 to 89, 106 and 107 are formed in desired regions of the EPI 68. A silicon oxide film 176 is formed on the upper surface of the EPI 68, and then, a photoresist 177 is formed on the silicon oxide film 176. Thereafter, openings are formed, on regions where P type buried layers 178 to 180 and 181 are to be formed, in the photoresist 177. Subsequently, ions of a P type impurity such as boron (B++) are implanted from the surface of the EPI 68.

Then, by using the same photoresist 177, a second ion implantation step is performed without thermally diffusing the P type buried layers 178 to 181. Specifically, ions of a P type impurity such as boron (B+) are implanted from above the photoresist 177. By this second ion implantation step, P type diffusion layers 182 to 185 are formed. Thereafter, the photoresist 177 is removed. Thus, in this embodiment, dedicated thermal diffusion steps for thermally diffusing the P type buried layers 178 to 181 and the P type diffusion layers 182 to 185 are omitted.

Here, after the LOCOSs 87, 89, 106 and 107 are formed, boron ions (B++, B+) are implanted from above the LOCOSs

87, 89, 106 and 107. This manufacturing method makes it possible to prevent occurrence of crystal defects caused by heat in formation of the LOCOSs 87, 89, 106 and 107 from the surface of the EPI 68 damaged by the implantation of boron ions (B++, B+) having a relatively large molecular size. Specifically, by the implantation of boron ions after the formation of the LOCOSs 87, 89, 106 and 107, the heat in the formation of the LOCOSs 87, 89, 106 and 107 can be prevented from being applied to the damaged region.

Figure 14:
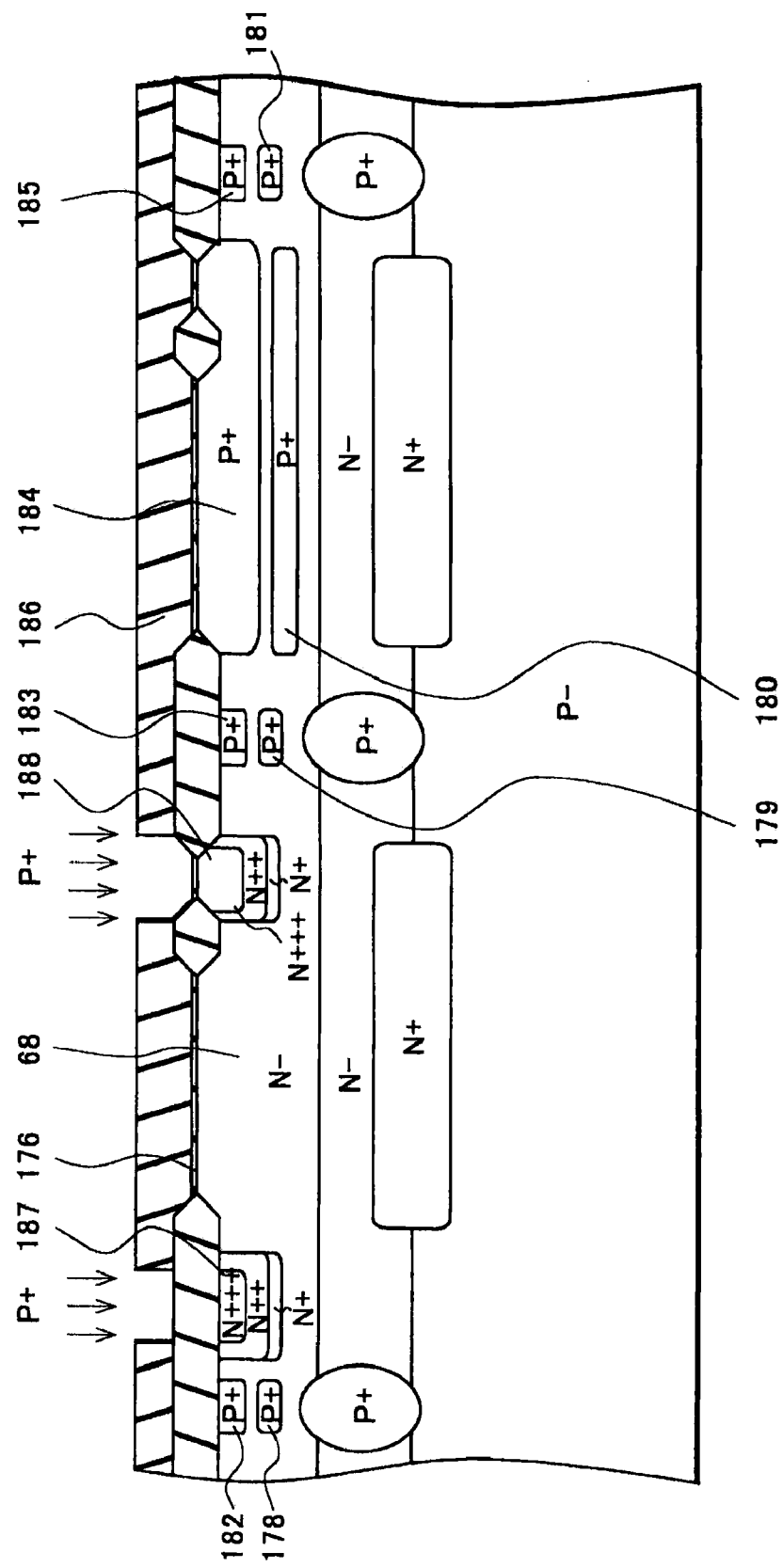
FIG. 14 is a cross-sectional view showing the method of manufacturing a semiconductor device according to the fourth preferred embodiment of the present invention.

Next, as shown in FIG. 14, a photoresist 186 is formed on the silicon oxide film 176. Then, openings are formed, on regions where N type diffusion layers 187 and 188 are to be formed, in the photoresist 186. Subsequently, ions of an N type impurity such as phosphorus (P+) are implanted from the surface of the EPI 68. Thereafter, the photoresist 186 is removed, and then, the silicon oxide film 176 is removed after thermal diffusion is performed.

By the above thermal diffusion step, the P type buried layers 178 to 181, the P type diffusion layers 182 to 185, and the N type diffusion layers 187 and 188 are thermally diffused, and consequently, M-ISOs 70, 73 and 76 (see FIG. 15), U-ISOs 71, 74 and 77, a P type diffusion layer 98 (see FIG. 15), and N type diffusion layers 85 and 86 (see FIG. 15) are formed. In the following description, the P type buried layer 180 and the P type diffusion layer 184 are connected by thermal diffusion to form the P type diffusion layer 98 (see FIG. 15). Moreover, although not shown in FIG. 14, the N type diffusion layers 85 and 86 are formed in the same step as that of an N type diffusion layer configuring a back gate region of a P channel MOS transistor. Aside from this, the N type diffusion layers 85 and 86 may be formed, or may not be formed.

As described with reference to FIGS. 13 and 14, the second ion implantation step is continuously performed after the first ion implantation step without performing any dedicated thermal diffusion step for thermally diffusing the P type buried layers 178 to 181. Thereafter, the ion implantation step is performed to form the N type diffusion layers 85 and 86 without performing any thermal diffusion step for thermally diffusing the P type diffusion layers 182 to 185, and after that, the above thermal diffusion step is performed. By use of this manufacturing method, the M-ISOs 70, 73 and 76, the U-ISOs 71, 74 and 77, the P type diffusion layer 98, and the N type diffusion layers 85 and 86 are formed in the single thermal diffusion step. Specifically, by omitting two dedicated thermal diffusion steps after the first and second ion implantation steps, lateral diffusion widths W7 to W9 of the L-ISOs 69, 72 and 75 (see FIG. 2) can be reduced, and consequently, formation regions of the ISOs 61, 62 and 63 (see FIG. 2) can also be reduced in size.

Furthermore, in the first ion implantation step, the ion implantation is performed at a higher accelerating voltage than that in the second ion implantation step. Moreover, the M-ISOs 70, 73 and 76 are formed near the L-ISOs 69, 72 and 75. This manufacturing method makes it possible to surely connect the M-ISOs 70, 73 and 76 and the L-ISOs 69, 72 and 75, respectively, while reducing upward expansion amounts of the L-ISOs 69, 72 and 75.

In addition, by setting a low impurity concentration in each of the L-ISOs 69, 72 and 75, the lateral diffusion widths W7 to W9 of the L-ISOs 69, 72 and 75 can be reduced, and hence, the formation regions of the ISOs 61 to 63 can also be reduced in size. Similarly, by reducing downward expansion amounts of the U-ISOs 71, 74 and 77, lateral diffusion widths W10 to W12 of the U-ISOs 71, 74 and 77 (see FIG. 2) can be reduced.

Figure 15:
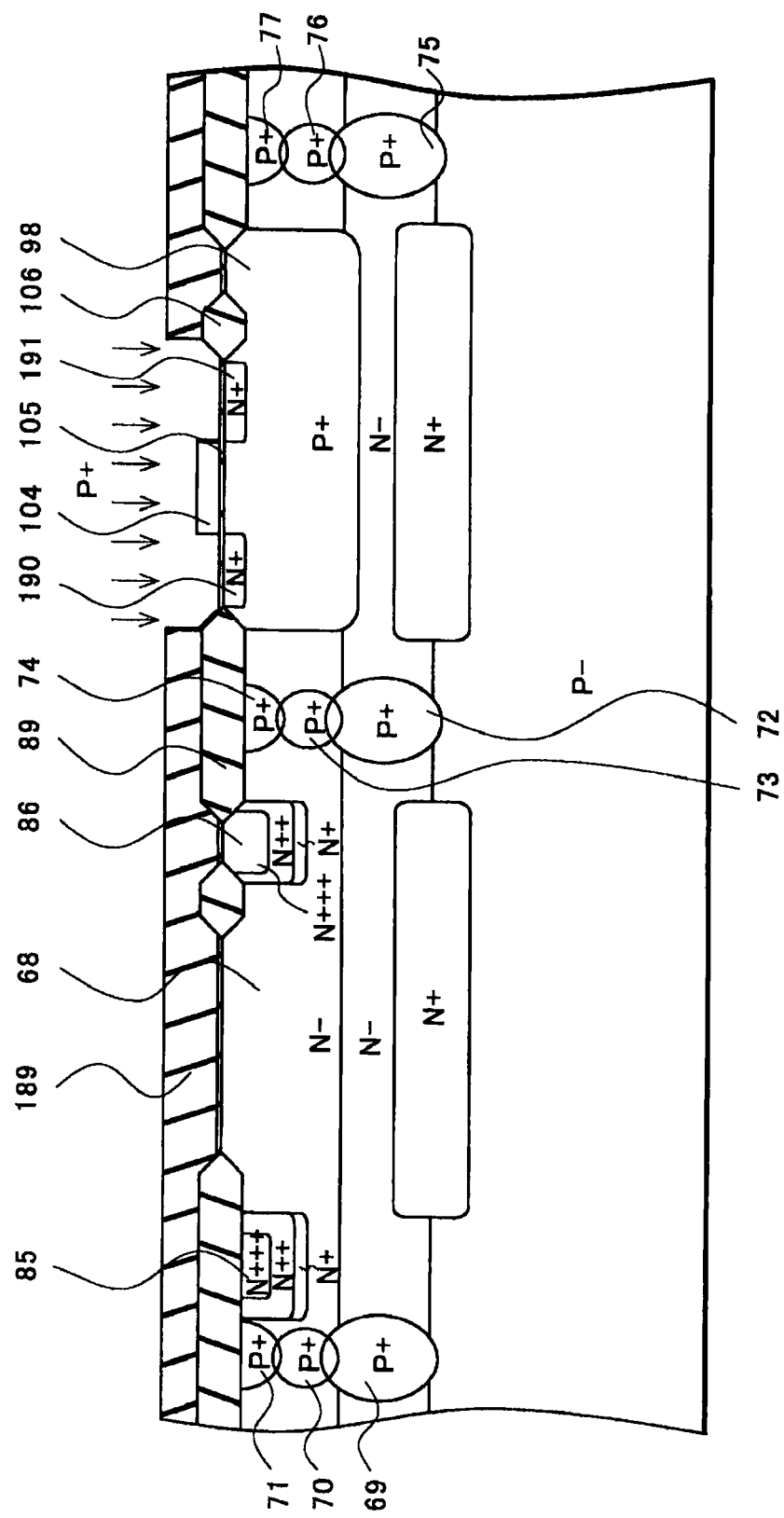
FIG. 15 is a cross-sectional view showing the method of manufacturing a semiconductor device according to the fourth preferred embodiment of the present invention.

Next, as shown in FIG. 15, a gate oxide film 105 is formed on the EPI 68. On the gate oxide film 105, a gate electrode 104 formed by stacking, for example, a polysilicon film and a tungsten silicide film is formed. Thereafter, a photoresist 189 is formed on the gate oxide film 105, and then, openings are formed, on regions where N type diffusion layers 190 and 191 are to be formed, in the photoresist 189. From the surface of the EPI 68, ions of an N type impurity such as phosphorus (P+) are implanted. In this event, by utilizing the LOCOSs 89 and 101 and the gate electrode 104 as masks, the N type diffusion layers 190 and 191 can be formed with a high positional accuracy. Thereafter, the photoresist 189 is removed, and then, thermal diffusion is performed. By the thermal diffusion step, the N type diffusion layers 190 and 191 are thermally diffused, and then N type diffusion layers 100 and 101 (see FIG. 16) are formed.

Figure 16:
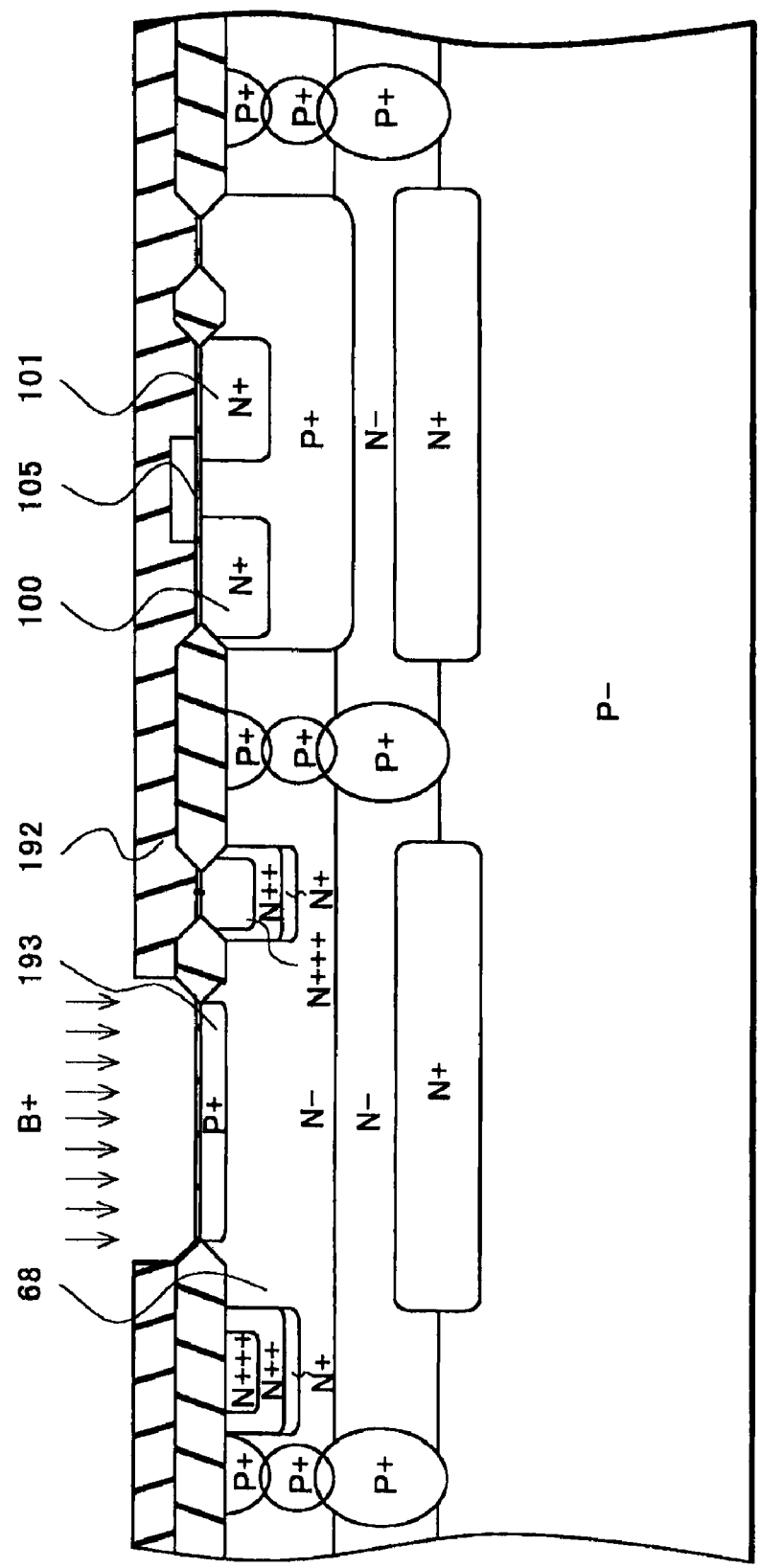
FIG. 16 is a cross-sectional view showing the method of manufacturing a semiconductor device according to the fourth preferred embodiment of the present invention.

Next, as shown in FIG. 16, a photoresist 192 is formed on the gate oxide film 105, and then, an opening is formed, in a region where a P type diffusion layer 193 is to be formed, in the photoresist 192. From the surface of the EPI 68, ions of a P type impurity such as boron (B) are implanted. Thereafter, the photoresist 192 is removed, and then, thermal diffusion is performed. By the thermal diffusion step, the P type diffusion layer 193 is thermally diffused, and a P type diffusion layer 79 (see FIG. 17) is formed.

Figure 17:
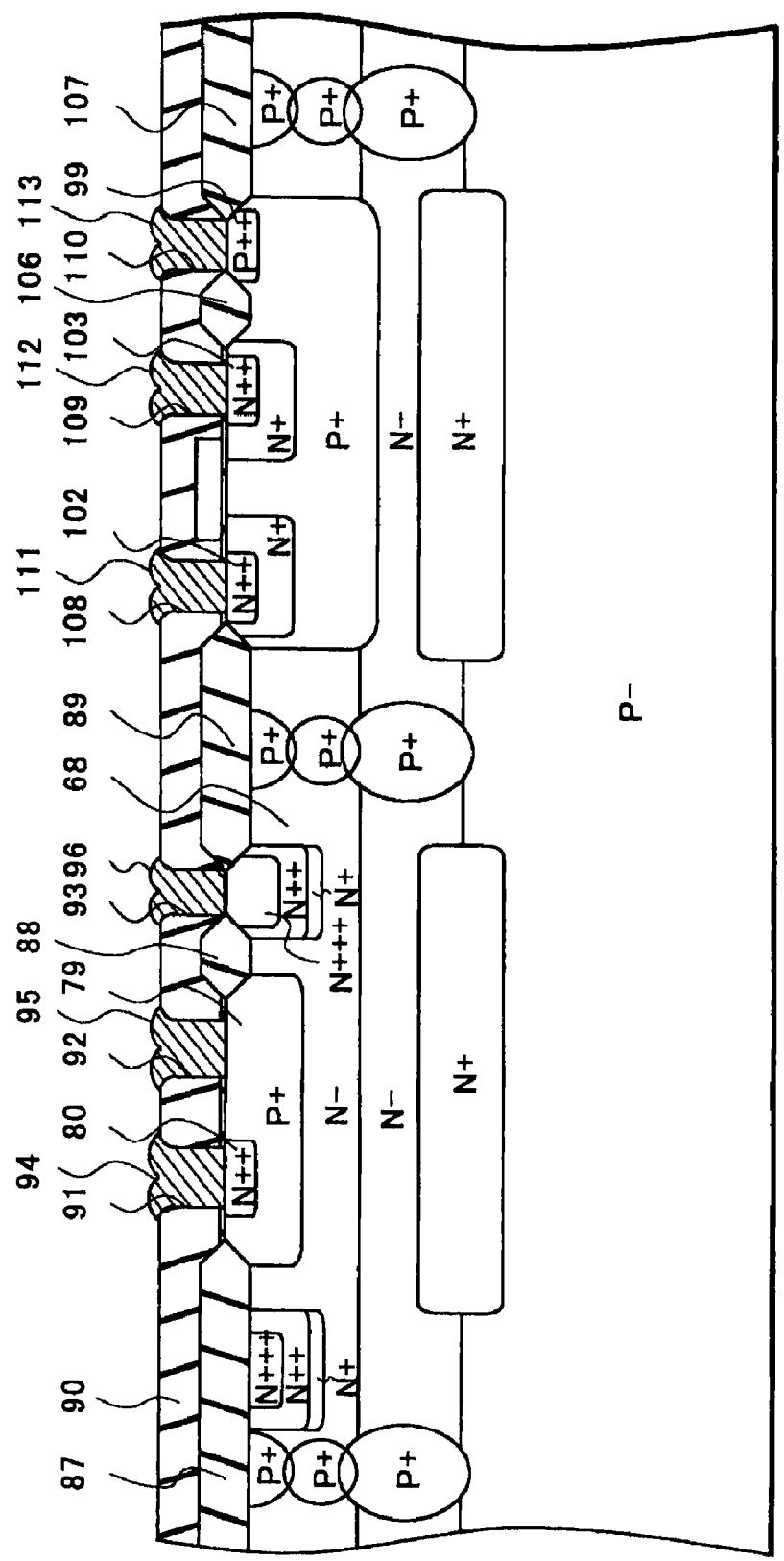
FIG. 17 is a cross-sectional view showing the method of manufacturing a semiconductor device according to the fourth preferred embodiment of the present invention.

Lastly, as shown in FIG. 17, after N type diffusion layers 80, 102 and 103 are formed, a P type diffusion layer 99 is formed. Subsequently, as an insulating layer 90, an NSG film, a BPSG film and the like are deposited on the EPI 68. Thereafter, contact holes 91 to 93 and 108 to 110 are formed in the insulating layer 90 by dry etching. In the contact holes 91 to 93 and 108 to 110, aluminum alloy films described above are selectively formed. Thus, an emitter electrode 94, a base electrode 95, a collector electrode 96, a source electrode 111, a drain electrode 112 and a back gate electrode 113 are formed.

In this embodiment, description has been given of the case where the two ion implantation steps are continuously performed by use of the same resist mask from above the LOCOSs 87 to 89, 106 and 107 in formation of the diffusion layers which form the ISOs. However, the preferred embodiment of the present invention is not limited to the above case. For example, the preferred embodiment of the present invention may also be applied to the case where three or more ion implantation steps are continuously performed by use of the same resist mask from above the LOCOSs 87 to 89, 106 and 107, and where multiple P type buried layers are formed respectively between the L-ISOs 69, 72, and 75 and the U-ISOs 71, 74, and 77. Besides the above, various changes can be made without departing from the scope of the present invention.

Next, a semiconductor device according to a fifth preferred embodiment of the present invention will be described with reference to FIGS. 18A and 19B. FIG. 18A is a cross-sectional view showing the semiconductor device according to this embodiment, and FIG. 18B is a plan view showing an NPN transistor shown in FIG. 18A. FIG. 19A is a graph showing an impurity concentration and a diffusion depth in each of buried layers and a diffusion layer which form an ISO according to this embodiment. FIG. 19B is a cross-sectional view showing the ISO according to this embodiment.

It should be noted that, in this embodiment, the shapes of ISOs 201 to 203 are basically different from those of the ISOs 1 to 3 shown in FIG. 1. Moreover, an NPN transistor 204 and an N channel MOS transistor 205, which are formed in islands partitioned with the ISOs 201 to 203, have substantially the same shapes as those of the NPN transistor 4 and the N channel MOS transistor 5 shown in FIG. 1. Thus, the above description of FIG. 1 will be referred to accordingly, and the same constituent components are denoted by the same reference numerals.

As shown in FIG. 18A, a first N type EPI 7 is formed on a P type substrate 6. On the EPI 7, a second EPI 8 is formed. The EPIs 7 and 8 are divided into a plurality of islands by the ISOs 201 to 203. The NPN transistor 204 is formed in one of the islands, and the N channel MOS transistor 205 is formed in another island.

The ISO 201 is formed of a P type buried layer 206 (hereinafter, referred to as an L-ISO 206), a P type buried layer 207 (hereinafter, referred to as an M-ISO 207) and a P type diffusion layer 208 (hereinafter, referred to as a U-ISO 208). As indicated by a circle 209, the L-ISO 206 and the U-ISO 208 partially overlap with each other. The M-ISO 207 further overlaps with the overlapping region indicated by the circle 209. Moreover, the ISO 201 including the M-ISO 207 forms a PN junction region with an N type diffusion layer 23. As in the case of the ISO 201 described above, the ISO 202 is formed of P type buried layers 210 and 211 and a P type diffusion layer 212 (hereinafter, referred to as an L-ISO 210, an M-ISO 211 and a U-ISO 212, respectively), and the ISO 203 is formed of P type buried layers 213 and 214 and a P type diffusion layer 215 (hereinafter, referred to as an L-ISO213, an M-ISO 214 and a U-ISO 215, respectively).

As shown in FIG. 18B, a region surrounded by solid lines 216 to 220 indicates the U-ISOs 208 and 212. A region surrounded by dotted lines 221 and 222 indicates the N type diffusion layers 23 and 24. A region surrounded by a dashed line 223 indicates a P type diffusion layer 19. A region surrounded by a solid line 224 indicates an N type diffusion layer 20. As shown in FIG. 18B, the N type diffusion layers 23 and 24 are circularly arranged in the inner side of the ISOs 201 and 202, and form PN junction regions with the ISOs 201 and 202 including the M-ISOs 207 and 211, respectively.

In the cross section of FIG. 18A, the U-ISOs 208 and 212 are shown as separate diffusion layers. However, the U-ISOs 208 and 212 are, in fact, formed as one circular diffusion layer. This also applies to the M-ISOs 207 and 211, the L-ISOs 206 and 210, N type buried layers 21 and 22, and the N type diffusion layers 23 and 24.

In FIG. 19A, the vertical axis indicates impurity concentrations in the L-ISO 206, the M-ISO 207 and the U-ISO 208, and the horizontal axis indicates diffusion depths thereof. Moreover, a solid line represents the entire ISO 201, a dotted line represents the U-ISO 208, a dashed line represents the M-ISO 207, and a chain double-dashed line represents the L-ISO 206.

As indicated by the dotted line, the U-ISO 208 is formed so as to have its impurity concentration peak positioned in a region where the depth from a surface of the EPI 8 is approximately 0.3 μm. As indicated by the dashed line, the M-ISO 207 is formed so as to have its impurity concentration peak positioned in a region where the depth from the surface of the EPI 8 is approximately 0.5 μm. As indicated by the chain double-dashed line, the L-ISO 206 is formed so as to have its impurity concentration peak positioned in a region where the depth from the surface of the EPI 8 is approximately 1.75 μm. Moreover, as indicated by the solid line, the ISO 201 has, within a range of 0.3 μm to 0.5 μm from the surface of the EPI 8, a region where the impurity concentration peak fluctuates at a high concentration due to the overlapping of the M-ISO 207 and the U-ISO 208. Furthermore, although the U-ISO 208 and the L-ISO 206 overlap with each other in a region where the depth from the surface of the EPI 8 is approximately 1.0 μm, the impurity concentration of $1.0 \times 10^{17}/cm^2$ or more is maintained also in this overlapping region.

This structure makes it possible to prevent, from crossing the ISO 201 and spreading to the adjacent other islands, a depletion layer spreading from a PN junction region of the P type ISO 201 and the P type substrate 6 with the N type EPIs 7 and 8 and the N type buried layer 18. Thus, occurrence of a leak current between adjacent elements is prevented.

In FIG. 19B, d1 indicates the depth of an impurity concentration peak position of the U-ISO 208, d2 indicates the depth of an impurity concentration peak position of the M-ISO 207, d3 indicates the depth up to the center region of the total thickness of the EPIs 7 and 8, d4 indicates the depth up to the overlapping region of the U-ISO 208 and the L-ISO 206, and d5 indicates the depth of an impurity concentration peak position of the L-ISO 206. As described above with reference to FIG. 19A, d1 is approximately 0.3 μm, d2 is approximately 0.5 μm, d3 is approximately 0.8 μm, d4 is approximately 1.0 μm, and d5 is approximately 1.75 μm.

As shown in FIG. 19B, the impurity concentration peaks of the U-ISO 208 and the M-ISO 207 are positioned closer to the surface of the EPI 8 than the center region d3 of the EPIs 7 and 8. As a result, in the ISO 201, the regions of the M-ISO 207 and the U-ISO 208 each have a higher impurity concentration than that of the region of the L-ISO 206, and thus, lateral diffusion is likely to be increased in the regions of the M-ISO 207 and the U-ISO 208. Moreover, since the impurity concentration of the EPI 8 is lower than that of the L-ISO 206, the ISO 201 is caused to have a shape in which the M-ISO 207 and the U-ISO 208 that are flattened in a horizontal direction are arranged on the L-ISO 206. Furthermore, the U-ISO 208 and the M-ISO 207 overlap with each other, and the ISO 201 forms a PN junction region with the N type diffusion layer 23 in the region at the depth of approximately 0.3 μm to 0.5 μm from the surface of the EPI 8. In this region with a high concentration of the P type impurity, lateral diffusion is likely to be increased while an increase in a diffusion width W13 of the M-ISO 207 is suppressed by the N type diffusion layer 23. Thus, by reducing the lateral diffusion width of the ISO 201, the device size of the NPN transistor 204 is reduced. In addition, as shown in FIGS. 18A and 18B, the N type diffusion layers 21 to 24 are circularly arranged in the inner side of the ISOs 201 and 202. Thus, the diffusion widths of the ISOs 201 and 202 are also suppressed in the entire circumference.

Furthermore, the M-ISO 207 further overlaps with the overlapping region indicated by the circle 209. By use of this structure, the three diffusion layers 206 to 208 allow the overlapping region indicated by the circle 209 to be designed to have a desired impurity concentration or more. Thus, an upward expansion amount of the L-ISO 206 and a downward expansion amount of the U-ISO 208 can be reduced. Moreover, the lateral diffusion of the ISO 201 is suppressed by reducing the diffusion width W13 of the M-ISO 207 and a diffusion width W14 of the L-ISO 206. Thus, the device size of the NPN transistor 204 is reduced.

In this embodiment as well, a distance L5 between the P type diffusion layer 19 and the M-ISO 207 as well as a distance L6 between the P type diffusion layer 19 and the L-ISO 206 shown in FIG. 18A can be shortened. By use of this structure, the breakdown voltage characteristics of the NPN transistor 204 can be maintained, and the device size of the NPN transistor 204 can be reduced, in this embodiment, as in the first preferred embodiment described with reference to FIG. 1.

Description has been given of the structure in which the two EPIs 7 and 8 are deposited on the substrate 6 and the ISOs 201 to 203 are formed in the EPIs 7 and 8. However, the preferred embodiment of the present invention is not limited to this case. The preferred embodiment of the present invention may also be applied to, for example, the case where three or more EPIs are deposited on a substrate and ISOs having the above structure are formed in the plurality of EPIs. Even in such a case, the impurity concentration of the ISOs can be controlled while the lateral diffusion of the ISOs is suppressed.

In addition, description has been given of the structure in which the thickness of the first EPI 7 is smaller than that of the second EPI 8. However, the preferred embodiment of the present invention is not limited to this structure. The preferred embodiment of the present invention may also be applied to, for example, the structure in which the thickness of the first EPI 7 is equal to that of the second EPI 8, or the structure in which the thickness of the first EPI 7 is larger than that of the second EPI 8. In other words, the same effect can be obtained by forming ISOs with the above structure in EPIs which are deposited on the substrate, and which have the above-described total thickness. Here, the overlapping region (the region indicated by the circle 209) of the U-ISO 208 and the L-ISO 206 may be formed in the first EPI 7.

Furthermore, description has been given of the structure in which the N type buried layers 21, 22 and the N type diffusion layers 23, 24 used as a collector region of the NPN transistor 204 are arranged so as to surround the P type diffusion layer 19. However, the preferred embodiment of the present invention is not limited to this structure. For example, in a structure where a diode is arranged in an island region, the same effect can be obtained by utilizing a structure in which an N type diffusion layer (including an N type buried layer if the structure has an N type buried layer formed therein) used as a cathode region is arranged so as to surround a P type diffusion layer used as an anode region. Besides the above, various changes can be made without departing from the scope of the present invention.

Next, a method of manufacturing a semiconductor device according to a sixth preferred embodiment of the present invention will be described with reference to FIGS. 20 to 22. As described above, an NPN transistor 204 and an N channel MOS transistor 205 have substantially the same shapes as those of the NPN transistor 4 and the N channel MOS transistor 5 shown in FIG. 1, respectively. Thus, the above description of FIG. 3 and FIGS. 5 to 9 will be referred to accordingly, and the same constituent components are denoted by the same reference numerals.

Firstly, as shown in FIG. 3, a P type substrate 6 is provided, and then, N type buried layers 122 and 123 are formed in the substrate 6. For details about the manufacturing method, the description of FIG. 3 is referred to.

Figure 20:
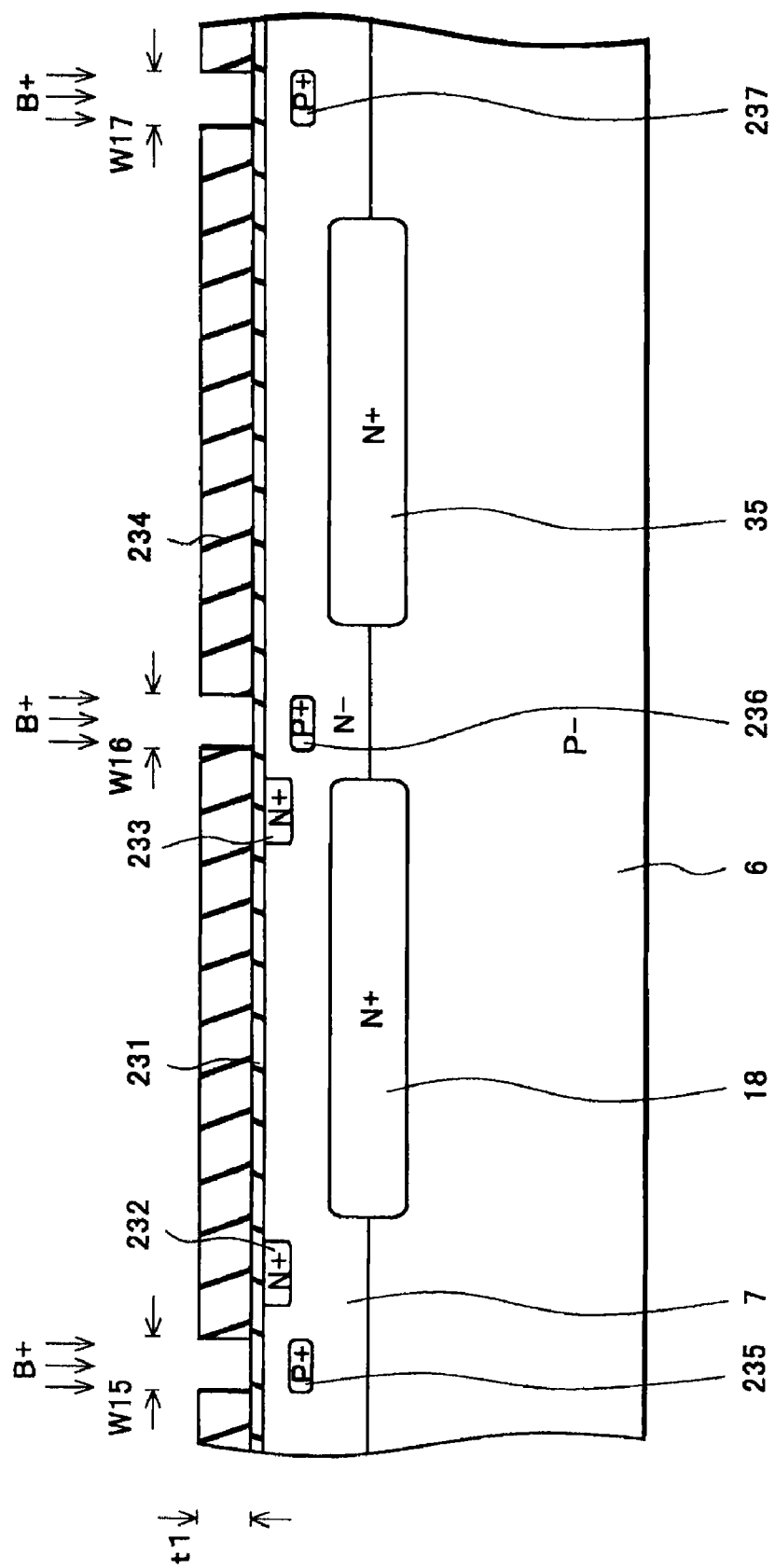
FIG. 20 is a cross-sectional view showing a method of manufacturing a semiconductor device according to a sixth preferred embodiment of the present invention.

Then, as shown in FIG. 20, a first N type EPI 7 is formed on the substrate 6. In this event, by heat treatment in the formation step of the EPI 7, the N type buried layers 122 and 123 (see FIG. 3) are thermally diffused, and N type buried layers 18 and 35 are formed.

Thereafter, a silicon oxide film 231 is formed on the EPI 7, and then, N type diffusion layers 232 and 233 are formed. Subsequently, a photoresist 234 is formed on the silicon oxide film 231, and openings are formed, on regions where P type buried layers 235 to 237 are to be formed, in the photoresist 234. Then, ions of a P type impurity such as boron (B+) are implanted from a surface of the EPI 7 at an accelerating voltage of 80 keV and a dose of $3.0 \times 10^{13}/cm^2$. Thereafter, the photoresist 234 and the silicon oxide film 231 are removed.

Here, a thickness t1 of the photoresist 234 is 1.8 μm, for example, and the line widths W15 to W17 on the formation regions of the P type buried layers 235 to 237 are each 1.2 μm, for example. This is because the following problem occurs when openings for ion implantation are formed in a photoresist having a large thickness. When openings are formed in a photoresist having a large thickness, etching time is extended. Thus, side faces, of the openings, of the photoresist are likely to droop. Specifically, the closer to the upper end of the photoresist, the longer the etching time. Accordingly, the closer to the upper end of each of the openings, the larger the opening area. As a result, the thickness of the drooping region of the photoresist is set smaller than that of the other region. If ions of an impurity are implanted at an accelerating voltage according to the thick portion of the photoresist, ions of the impurity pass through the photoresist in the drooping region thereof. After that, ions of the impurity are implanted into a region wider than the designed line width, and then, thermal diffusion is performed. Thus, it becomes difficult to perform minute processing.

To avoid the above problem, by reducing the thickness t1 of the photoresist 234 as described above, the etching time of the photoresist 234 is shortened, and drooping in the openings is prevented. Moreover, minute processing for wiring widths W15 to W17 in the photoresist 234 is made possible. Furthermore, the accelerating voltage in ion implantation is lowered in accordance with reduction in the thickness t1 of the photoresist 234. As a result, impurity concentration peaks of the P type buried layers 235 to 237 are set closer to the surface of the EPI 7. Thus, it becomes easier for the P type buried layers 235 to 237 to expand upward to an EPI 8. Accordingly, heat treatment time for diffusing the P type buried layers 235 to 237 can be shortened. Thus, lateral diffusion widths of the P type buried layers 235 to 237 can be reduced.

Next, as shown in FIGS. 5 and 6, the second N type EPI 8 is formed on the EPI 7. After N type diffusion layers 23 and 24 are formed in the EPI 8, LOCOSs 25 to 27, 44 and 45 are formed. Dedicated thermal diffusion steps for thermally diffusing the P type buried layers 235 to 237 (see FIG. 20) are not performed in this embodiment, either. In this event, by heat treatment in the formation step of the EPI 8, the N type buried layers 232 and 233 (see FIG. 20) are thermally diffused, and N type buried layers 21 and 22 are formed. Similarly, the P type buried layers 235 to 237 are thermally diffused, and L-ISOs 206, 210 and 213 (see FIG. 21) are formed. It should be noted that the description of FIGS. 5 and 6 will be referred to for details about the manufacturing method.

Figure 21:
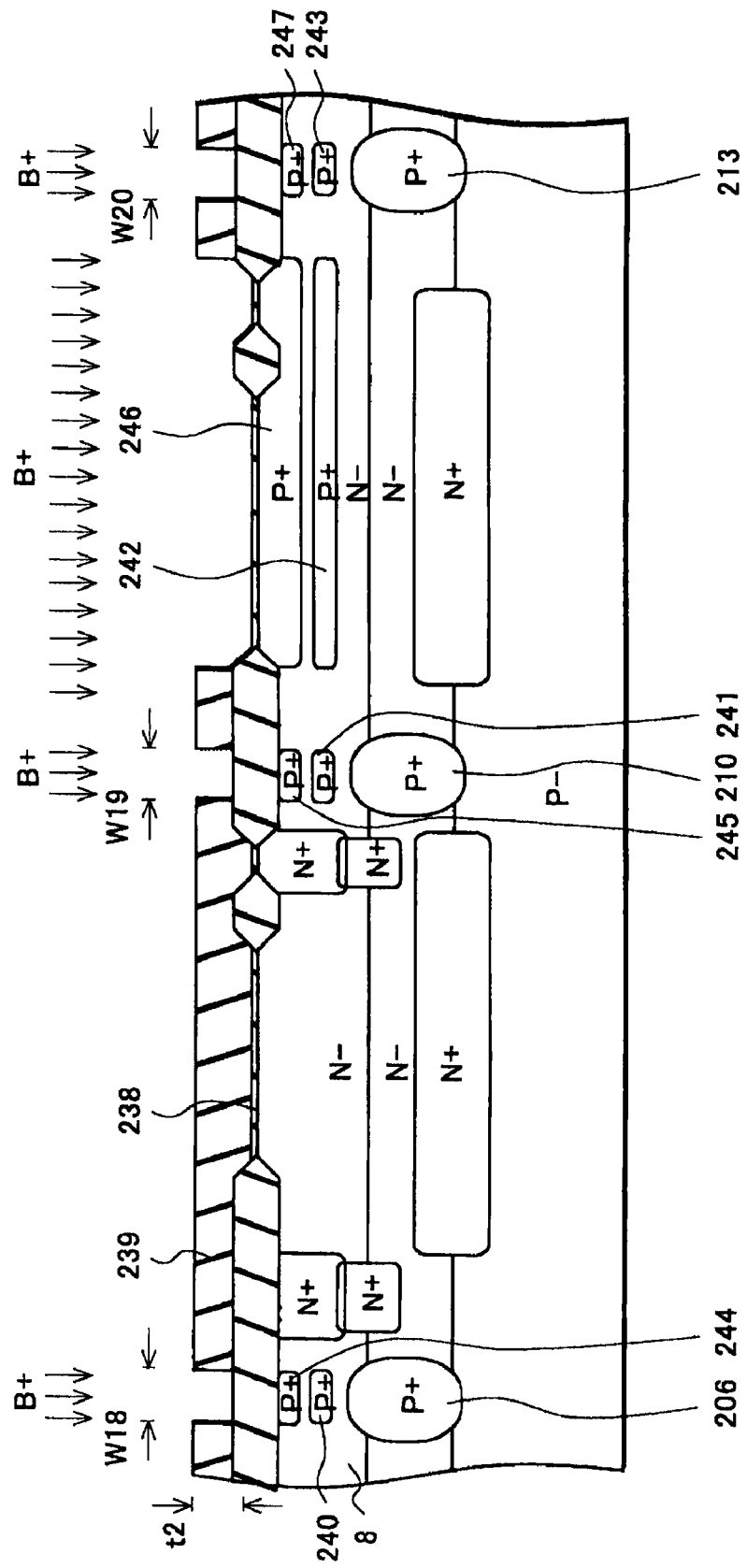
FIG. 21 is a cross-sectional view showing the method of manufacturing a semiconductor device according to the sixth preferred embodiment of the present invention.

Next, as shown in FIG. 21, a silicon oxide film 238 is formed on the upper surface of the EPI 8, and, on the silicon oxide film 238, a photoresist 239 is formed. Thereafter, openings are formed, on regions where P type buried layers 240 to 243 are to be formed, in the photoresist 239. Subsequently, ions of a P type impurity such as boron (B++) are implanted from the surface of the EPI 8 at an accelerating voltage of 300 keV and a dose of $2.5 \times 10^{13}/cm^2$.

In this event, a thickness t2 of the photoresist 239 is, for example, 1.8 μm, and line widths W18 to W20 respectively on the formation regions of the P type buried layers 240 to 243 are, for example, 1.2 μm. As described above, reduction in the thickness t2 of the photoresist 239 enables minute processing of the line widths W18 to W20. Furthermore, by lowering the accelerating voltage in the implantation of ions of an impurity, impurity concentration peaks of the P type buried layers 240, 241 and 243 are set closer to the surface of the EPI 8.

Next, second ion implantation is performed by use of the same photoresist 239 without thermally diffusing the P type buried layers 240 to 243. Specifically, ions of a P type impurity such as boron (B+) are implanted from above the photoresist 239 at an accelerating voltage of 190 keV and a dose of $8.0 \times 10^{12}/cm^2$. By this second ion implantation step, P type diffusion layers 244 to 247 are formed. Thereafter, the photoresist 239 is removed, and thermal diffusion is performed.

After M-ISOs 207, 211 and 214 (see FIG. 22), a P type diffusion layer 36 and U-ISOs 208, 212 and 215 (see FIG. 22) are formed, the silicon oxide film 238 is removed.

Thus, the second ion implantation step is continuously performed after the first ion implantation step without performing any dedicated thermal diffusion step for thermally diffusing the P type buried layers 240 to 243. Thereafter, the thermal diffusion step is performed. By use of this manufacturing method, the M-ISOs 207, 211 and 214, the P type diffusion layer 36 and the U-ISOs 208, 212 and 215 are formed in the single thermal diffusion step.

Moreover, by lowering the accelerating voltage in the implantation of ions of an impurity in accordance with the thickness t2 of the photoresist 239, impurity concentration peaks of the U-ISOs 208, 212 and 215 are set to be closer to the surface of the EPI 8. By use of this manufacturing method, despite the implantation of boron ions (B++, B+) having a relatively large molecular size, regions of the EPI 8 damaged by the boron are reduced in size. It should be noted that, after all the ion implantation steps are finished, annealing is performed in a nitrogen atmosphere for restoring the damage.

Next, as shown in FIGS. 7 to 9, a gate oxide film 43 and a gate electrode 42 are formed on the EPI 8. Thereafter, N type diffusion layers 38 to 41 and P type diffusion layers 19 and 37 are formed. For details about the manufacturing method, the description of FIGS. 7 to 9 will be referred to.

Figure 22:
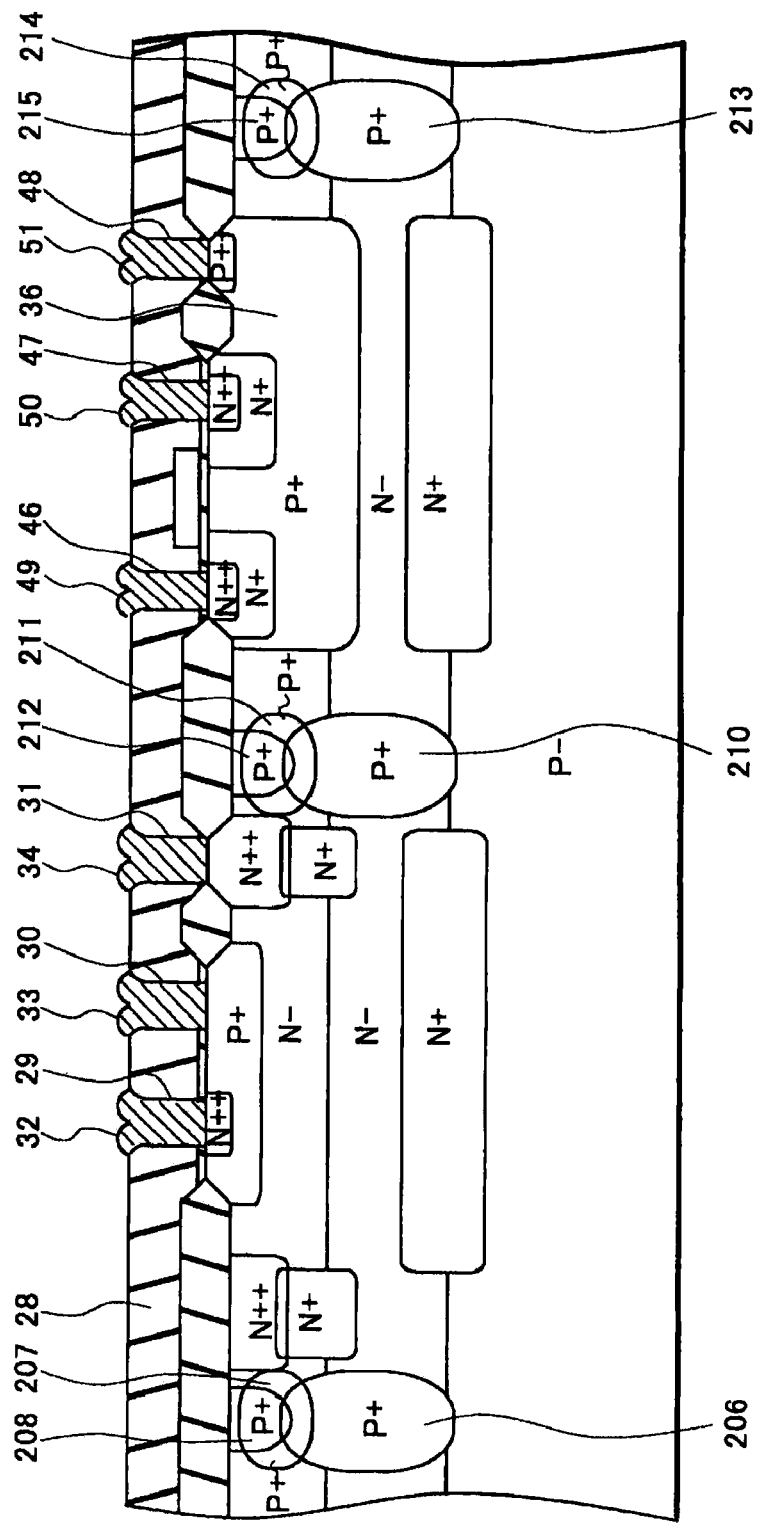
FIG. 22 is a cross-sectional view showing the method of manufacturing a semiconductor device according to the sixth preferred embodiment of the present invention.

Lastly, as shown in FIG. 22, on the EPI 8, an NSG film, a BPSG film and the like, for example, are deposited as an insulating layer 28. Subsequently, contact holes 29 to 31 and 46 to 48 are formed in the insulating layer 28 by dry etching. In the contact holes 29 to 31 and 46 to 48, aluminum alloy films are selectively formed, as in the first preferred embodiment of the present invention. Thus, an emitter electrode 32, a base electrode 33, a collector electrode 34, a source electrode 49, a drain electrode 50, and a back gate electrode 51 are formed.

In this embodiment, description has been given of the case where the M-ISOs 207, 211 and 214 and the U-ISOs 208, 212 and 215 are formed from the surface of the EPI 8 in the formation of the ISOs. However, the preferred embodiment of the present invention is not limited to the above case. The preferred embodiment of the present invention may also be applied to the case where boron ions (B+) are implanted at an accelerating voltage of 40 keV and a dose of $4.0 \times 10^{12}/cm^2$ by using the photoresist 239 as the same mask, for example. In this case, the impurity concentrations in the formation regions of the U-ISOs 208, 212 and 215 are further increased. Besides the above, various changes can be made without departing from the scope of the present invention.

Next, a semiconductor device according to a seventh preferred embodiment of the present invention will be described with reference to FIGS. 23A and 23B and FIGS. 24A and 24B. FIG. 23A is a cross-sectional view showing the semiconductor device according to this embodiment, and FIG. 23B is a plan view showing an NPN transistor shown in FIG. 23A. FIG. 24A is a cross-sectional view showing an ISO according to this embodiment, and FIG. 24B is a view showing the ISO represented by a concentration distribution.

It should be noted that the shapes of ISOs 251 to 253 are basically different from those of the ISOs 61 to 63 shown in FIG. 2. In addition, an NPN transistor 254 and an N channel MOS transistor 255, which are formed in the islands partitioned with the ISOs 251 to 253, have substantially the same shapes as those of the NPN transistor 64 and the N channel MOS transistor 65 shown in FIG. 2. Thus, the above description of FIG. 2 will be referred to accordingly, and the same constituent components are denoted by the same reference numerals.

As shown in FIG. 23A, a first EPI 67 is formed on a substrate 66. On the EPI 67, a second EPI 68 is formed. The EPIs 67 and 68 are divided into a plurality of islands by the ISOs 251 to 253. The NPN transistor 254 is formed in one of the islands, and the N channel MOS transistor 255 is formed in another island.

The ISO 251 is formed of a P type buried layer 256 (hereinafter, referred to as an L-ISO 256), a P type buried layer 257 (hereinafter, referred to as an M-ISO 257) and a P type diffusion layer 258 (hereinafter, referred to as a U-ISO 258). As indicated by a circle 259, the L-ISO 256 and the U-ISO 258 partially overlap with each other. The M-ISO 257 further overlaps with the overlapping region indicated by the circle 259. Moreover, the ISO 251 including the M-ISO 257 forms a PN junction region with N type diffusion layers 81 and 83. As in the case of the ISO 251 described above, the ISO 252 is formed of P type buried layers 260 and 261 and a P type diffusion layer 262 (hereinafter, referred to as an L-ISO 260, an M-ISO 261 and a U-ISO 262, respectively), and the ISO 253 is formed of P type buried layers 263 and 264 and a P type diffusion layer 265 (hereinafter, referred to as an L-ISO 263, an M-ISO 264 and a U-ISO 265, respectively).

As shown in FIG. 23B, a region surrounded by solid lines 266 to 270 indicates the U-ISOs 258 and 262. A region surrounded by dotted lines 271 and 272 indicates N type diffusion layers 81 to 86. A region surrounded by a dashed line 273 indicates a P type diffusion layer 79. A region surrounded by a solid line 274 indicates an N type diffusion layer 80. As shown in FIG. 23B, the N type diffusion layers 81 to 86 are circularly arranged in the inner side of the ISOs 251 and 252, and form PN junction regions with the ISOs 251 and 252 including the M-ISOs 257 and 261, respectively.

In FIG. 24A, d6 indicates the depth of an impurity concentration peak position of the U-ISO 258, d7 indicates the depth of an impurity concentration peak position of the M-ISO 257, d8 indicates the depth up to the center region of the total thickness of the EPIs 67 and 68, d9 indicates the depth up to the overlapping region of the U-ISO 258 and the L-ISO 256, and d10 indicates the depth of an impurity concentration peak position of the L-ISO 256. Here, d6 is approximately 0.3 µm, d7 is approximately 0.5 µm, d8 is approximately 0.8 µm, d9 is approximately 1.0 µm, and d10 is approximately 1.75 µm.

As shown in FIG. 24A, the ISO 251 has substantially the same shape as that of the ISO 201 shown in FIG. 19B. Thus, the impurity concentration and the diffusion depth of the ISO 251 are as shown in FIG. 19A, and hence, the description of FIGS. 19A and 19B will be referred to accordingly.

The impurity concentration peaks of the U-ISO 258 and the M-ISO 257 are positioned closer to a surface of the EPI 68 than the center region d8 of the EPIs 67 and 68. Furthermore, the U-ISO 258 and the M-ISO 257 overlap with each other, and the ISO 251 forms the PN junction region with the N type diffusion layers 81 and 83 in the region at the depth of approximately 0.3 µm to 0.5 µm from the surface of the EPI 68. In the region having a high P type impurity concentration, lateral diffusion is likely to be increased while an increase in a diffusion width W21 of the M-ISO 257 is suppressed by the N type diffusion layers 81 and 83. Thus, by reducing the lateral diffusion width of the ISO 251, the device size of the NPN transistor 254 is reduced. In addition, as shown in FIGS. 23A and 23B, the N type diffusion layers 81 to 86 are circularly arranged in the inner side of the ISOs 251 and 252. Thus, diffusion widths of the ISOs 251 and 252 are also suppressed in the entire circumference.

Furthermore, the M-ISO 257 further overlaps with the overlapping region indicated by the circle 259. By use of this structure, the three diffusion layers 256 to 258 allow the overlapping region indicated by the circle 259 to be designed to have a desired impurity concentration or more. Thus, an upward expansion amount of the L-ISO 256 and a downward expansion amount of the U-ISO 258 can be reduced. Moreover, the lateral diffusion of the ISO 251 is suppressed by reducing a diffusion width W21 of the M-ISO 257 and a diffusion width W22 of the L-ISO 256. Thus, the device size of the NPN transistor 254 is reduced.

As shown in FIG. 24B, a heavy line 275 indicates an external shape of the ISO 251. Here, a region shown darker has a higher impurity concentration. It should be noted that, although not shown, the ISO 201 shown in FIG. 19B also has the same external shape.

Next, description will be given of the side (right part of the page showing FIGS. 24A and 24B) where the ISO 251 forms a PN junction region with the N type diffusion layers 81 and 83. In the region between the depths d7 to d9, the three diffusion layers 256 to 258 overlap with one another, and the lateral diffusion is likely to be extended. However, extension of the lateral diffusion in the overlapping region is suppressed by the N type diffusion layers 81 and 83. By contrast, in the region deeper than the depth d9, the diffusion width changes so as to form a moderately curved surface in accordance with the impurity concentration of the L-ISO 256. The diffusion width is extended as compared to that in the region where the above PN junction region is formed. As described above, the extension of the lateral diffusion of the L-ISO 256 can be suppressed by reducing the heat treatment time.

Also in this embodiment, a distance L7 between the P type diffusion layer 79 and the M-ISO 257 and a distance L8 between the P type diffusion layer 79 and the L-ISO 256 shown in FIG. 23A can be shortened. With this structure, the breakdown voltage characteristics of the NPN transistor 254 are maintained, and the device size of the NPN transistor 254 is reduced as in the preferred embodiment described with reference to FIG. 2.

Description has been given of the structure in which the two EPIs 67 and 68 are deposited on the substrate 66, and the ISOs 251 to 253 are formed in the EPIs 67 and 68. However, the preferred embodiment of the present invention is not limited to the above structure. For example, the preferred embodiment of the present invention may also be applied to the case where three or more EPIs are deposited on a substrate and ISOs having the above structure are formed in the plurality of EPIs. Also in this case, the impurity concentrations of the ISOs can be controlled while the lateral diffusion of the ISOs is suppressed.

Moreover, description has been given of the structure in which the thickness of the first EPI 67 is smaller than that of the second EPI 68. However, the preferred embodiment of the present invention is not limited to this structure. The preferred embodiment of the present invention may also be applied to the structure in which the thickness of the first EPI 67 is equal to that of the second EPI 68, or the structure in which the thickness of the first EPI 67 is larger than that of second EPI 68, for example. In other words, the same effect can be obtained by forming ISOs with the above structure in EPIs which are deposited on the substrate, and which has the above-described total thickness. Here, the overlapping region (the region indicated by the circle 259) of the U-ISO 258 and the L-ISO 256 may be formed in the first EPI 67.

Furthermore, description has been given of the structure in which the N type diffusion layers 81 to 86 used as a collector region of the NPN transistor 254 are arranged so as to surround the P type diffusion layer 79. However, the preferred embodiment of the present invention is not limited to this structure. For example, in a structure where a diode is arranged in an island region, the same effect can be obtained by utilizing a structure in which an N type diffusion layer used as a cathode region, for example, is arranged so as to surround a P type diffusion layer used as an anode region. Besides the above, various changes can be made without departing from the scope of the present invention.

Lastly, FIGS. 3 to 17 and FIGS. 20 to 22 described above are to be referred to for description about a method of manufacturing the semiconductor device shown in FIG. 23A, and hence, the description about the manufacturing method is omitted here. As described above, ISOs 251 to 253 have substantially the same shapes as those of the ISOs 201 to 203 shown in FIG. 18A, and thus, the manufacturing method of the ISOs 251 to 253 is also same as that of the ISOs 201 to 203. Moreover, an NPN transistor 254 and a N channel MOS transistor 255 have substantially the same shapes as those of the NPN transistor 64 and the N channel MOS transistor 65 shown in FIG. 2, respectively. Thus, the manufacturing method of the NPN transistor 254 and the N channel MOS transistor 255 is also same as that of the NPN transistor 64 and the N channel MOS transistor 65.

In the present invention, the plurality of diffusion layers, which form the ISO, are formed in the depth direction, so that the upward and downward expansion amounts of the individual diffusion layers are reduced. This structure makes it possible to reduce the size of the formation region of the isolation region.

Moreover, in the present invention, the two EPIs are formed on the substrate. With this structure, the diffusion width of the ISO formed in the first EPI is reduced, and hence, the formation region of the ISO is reduced in size.

Furthermore, in the present invention, the N type buried layer and the N type diffusion layer are disposed between the base region of the NPN transistor and the ISO so as to be connected to each other. This structure makes short-circuit less likely to occur between the base region and the ISO. Thus, the breakdown voltage characteristics of the NPN transistor are improved.

In addition, in the present invention, the N type diffusion layer is formed between the base region of the NPN transistor and the ISO. This structure makes short-circuit less likely to occur between the base region and the ISO. Thus, the breakdown voltage characteristics of the NPN transistor are improved.

Moreover, in the present invention, the N type diffusion layers disposed between the base region of the NPN transistor and the ISO have a triple diffusion structure. This structure makes short-circuit much less likely to occur between the base region and the ISO.

Furthermore, in the present invention, the ion implantation steps for the buried layers and the diffusion layers, all of which form the ISO, are continuously performed from the surface of the second EPI. This manufacturing method makes it possible to omit dedicated thermal diffusion steps for diffusing the buried layers, and also to prevent expansion of the formation region of the ISO.

In addition, in the present invention, the ion implantation steps for the buried layers and the diffusion layers, all of which form the ISO, are continuously performed from the surface of the second EPI. By use of this manufacturing method, the number of masks can be reduced, and consequently, manufacturing cost can also be reduced.

Moreover, in the present invention, the diffusion layers, which form the ISO, are formed after the LOCOS are formed.

By use of this manufacturing method, crystal defects caused in the surfaces of the formation regions of the diffusion layers and in regions adjacent thereto can be reduced.

Furthermore, in the present invention, the diffusion layers which form the ISO and the diffusion layers which form the back gate region of the MOS transistor are formed in the shared step. With this manufacturing method, expansion of the formation regions of the ISO can be suppressed by omitting the thermal diffusion steps.

What is claimed is:

1. A method of manufacturing a semiconductor device, comprising the steps of:
    preparing a one-conductivity-type semiconductor substrate, and then forming a first opposite-conductivity-type epitaxial layer on the semiconductor substrate;
    forming a second opposite-conductivity-type epitaxial layer on the first epitaxial layer after implanting ions of an impurity for forming a first one-conductivity-type buried diffusion layer into the first epitaxial layer; and
    forming an isolation region by firstly implanting ions of an impurity for forming a second one-conductivity-type buried diffusion layer from a surface of the second epitaxial layer, then continuously implanting ions of an impurity for forming a one-conductivity-type diffusion layer, and finally performing thermal diffusion, so as to connect the first one-conductivity-type buried diffusion layer, the second one-conductivity-type buried diffusion layer and the one-conductivity-type diffusion layer with one another.

2. The method of manufacturing a semiconductor device, according to claim 1, wherein ions of the impurity for forming the second one-conductivity-type buried diffusion layer and ions of the impurity for forming the one-conductivity-type diffusion layer are implanted by use of the same resist mask.

3. The method of manufacturing a semiconductor device, according to any one of claims 1 and 2, wherein, after a LOCOS oxide film is formed in the second epitaxial layer, ions of the impurity for forming the second one-conductivity-type buried diffusion layer and ions of the impurity for forming the one-conductivity-type diffusion layer are implanted from above the LOCOS oxide film.

4. The method of manufacturing a semiconductor device, according to claim 1, wherein, in the step of implanting ions of the impurity for forming the second one-conductivity-type buried diffusion layer and ions of the impurity for forming the one-conductivity-type diffusion layer, the ion implantation is performed so as to allow impurity concentration peaks of the second one-conductivity-type buried diffusion layer and impurity concentration peaks of the one-conductivity-type diffusion layer to be positioned closer to the surface of the second epitaxial layer than a center of the total thickness of the first and second epitaxial layers.

5. The method of manufacturing a semiconductor device, according to claim 4, wherein ions of the impurity for forming the second one-conductivity-type buried diffusion layer and ions of the impurity for forming the one-conductivity-type diffusion layer are implanted by use of the same resist mask.

* * * * *